US011670445B2

(12) United States Patent
Yoshioka et al.

(10) Patent No.: US 11,670,445 B2
(45) Date of Patent: Jun. 6, 2023

(54) INDUCTOR COMPONENT AND INDUCTOR COMPONENT MOUNTING SUBSTRATE

(71) Applicant: Murata Manufacturing Co., Ltd., Kyoto-fu (JP)

(72) Inventors: Yoshimasa Yoshioka, Nagaokakyo (JP); Kouji Yamauchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 237 days.

(21) Appl. No.: 17/076,609

(22) Filed: Oct. 21, 2020

(65) Prior Publication Data

US 2021/0125770 A1    Apr. 29, 2021

(30) Foreign Application Priority Data

Oct. 25, 2019 (JP) .............................. JP2019-194117

(51) Int. Cl.
*H01F 27/28* (2006.01)
*H01F 27/255* (2006.01)
*H01F 27/32* (2006.01)
*H01F 27/29* (2006.01)
*H05K 1/18* (2006.01)

(52) U.S. Cl.
CPC ....... *H01F 27/2804* (2013.01); *H01F 27/255* (2013.01); *H01F 27/29* (2013.01); *H01F 27/32* (2013.01); *H05K 1/181* (2013.01); *H01F 2027/2809* (2013.01); *H05K 2201/1003* (2013.01)

(58) Field of Classification Search
CPC ................. H01F 17/0006; H01F 17/04; H01F 2027/2809; H01F 27/255; H01F 27/2804; H01F 27/29; H01F 27/32; H05K 1/165; H05K 1/181; H05K 2201/086; H05K 2201/09672; H05K 2201/1003; H05K 3/4611
See application file for complete search history.

(56) References Cited

U.S. PATENT DOCUMENTS 6,280,858 B1 * 8/2001 Teshima ............... H05K 3/3463
428/646
2002/0017018 A1 * 2/2002 Ohkawara .............. B82Y 10/00
29/603.18
(Continued)

FOREIGN PATENT DOCUMENTS

JP   2010-507225 A    3/2010
JP   2013-211330 A   10/2013
(Continued)

*Primary Examiner* — William H. Mayo, III
*Assistant Examiner* — Rhadames Alonzo Miller
(74) *Attorney, Agent, or Firm* — Studebaker & Brackett PC

(57) ABSTRACT

An inductor component includes first and second inductor wiring lines, a first vertical wiring line, a second vertical wiring line, and a third vertical wiring line, wherein the first vertical wiring line and the second vertical wiring line are connected to the first end portion and the second end portion of the first inductor wiring line, respectively, and the third vertical wiring line and the second vertical wiring line are connected to the first end portion and the second end portion of the second inductor wiring line, respectively.

21 Claims, 10 Drawing Sheets

(56) References Cited

U.S. PATENT DOCUMENTS

| | | | |
|---|---|---|---|
| 2003/0137053 A1* | 7/2003 | Okayama | H01L 21/76877 257/E21.585 |
| 2004/0219341 A1* | 11/2004 | Kataoka | H05K 3/388 428/209 |
| 2014/0145816 A1* | 5/2014 | Sato | H01F 17/0013 336/208 |
| 2015/0084729 A1* | 3/2015 | Lee | H01F 17/0013 336/192 |
| 2016/0035476 A1* | 2/2016 | Mimura | H01F 41/046 336/199 |
| 2017/0098997 A1* | 4/2017 | Hamada | H01F 1/0306 |
| 2017/0345552 A1* | 11/2017 | Nakano | H01F 27/292 |
| 2018/0075965 A1* | 3/2018 | Yoshioka | H01F 27/292 |
| 2018/0294090 A1* | 10/2018 | Nishikawa | H01F 17/0033 |
| 2020/0013544 A1* | 1/2020 | Yoshioka | H01F 27/292 |
| 2020/0027645 A1* | 1/2020 | Yoshioka | H01F 27/255 |
| 2020/0335250 A1* | 10/2020 | Sukegawa | H01F 17/045 |
| 2020/0335261 A1* | 10/2020 | Sukegawa | H01F 27/006 |
| 2020/0335266 A1* | 10/2020 | Maki | H01F 41/04 |
| 2020/0373079 A1* | 11/2020 | Yoshioka | H01F 27/29 |
| 2021/0234415 A1* | 7/2021 | Taniguchi | H02K 1/187 |

FOREIGN PATENT DOCUMENTS

| | | | |
|---|---|---|---|
| JP | 2017-199774 A | | 11/2017 |
| JP | 2017199774 A | * | 11/2017 |
| JP | 2018-182024 A | | 11/2018 |

* cited by examiner

INDUCTOR COMPONENT AND INDUCTOR COMPONENT MOUNTING SUBSTRATE

CROSS-REFERENCE TO RELATED APPLICATION

This application claims benefit of priority to Japanese Patent Application No. 2019-194117, filed Oct. 25, 2019, the entire content of which is incorporated herein by reference.

BACKGROUND

Technical Field:

The present disclosure relates to an inductor component and an inductor component mounted substrate.

Background Art:

An inductor component disclosed in Japanese Unexamined Patent Application Publication No. 2013-211330 includes three inductor wiring lines. The inductor wiring lines are arranged inside a magnetic layer. An outer terminal is connected to a first end, in the extension direction, of each inductor wiring line. Furthermore, an outer terminal is similarly connected to a second end, which is on the opposite side from the first end in the extension direction, of each inductor wiring line. As a result, a total of six outer terminals are arranged on the outer surface of the inductor component.

SUMMARY

In the inductor component disclosed in Japanese Unexamined Patent Application Publication No. 2013-211330, the number of outer terminals that are provided is equal to the number of ends of the inductor wiring lines. Therefore, for example, it is necessary to design the inductor component so as to arrange the appropriate number of outer terminals on the surface of the inductor component while taking into account the positions of wiring lines and terminals on the substrate on which the inductor component is to be mounted. Therefore, as the number of outer terminals increases, the degree of freedom of design for the inductor component decreases and problems may arise such as it being more difficult to reduce the size of the inductor component.

Accordingly, a one embodiment of the present disclosure provides an inductor component that includes first and second inductor wiring lines that are arranged inside a magnetic layer and along which a current flows in a common direction between first end portions of the inductor wiring lines that are on one side and second end portions of the inductor wiring lines that are on another side in extension directions of the inductor wiring lines; a first vertical wiring line that is connected to the first end portion of the first inductor wiring line, penetrates through the magnetic layer, and is exposed at an outer surface of the magnetic layer; a second vertical wiring line that is connected to the second end portion of the first inductor wiring line, penetrates through the magnetic layer, and is exposed at the outer surface of the magnetic layer; and a third vertical wiring line that is connected to the first end portion of the second inductor wiring line, penetrates through the magnetic layer, and is exposed at the outer surface of the magnetic layer. The second vertical wiring line is connected to the second end portion of the second inductor wiring line.

Another embodiment of the present disclosure provides an inductor component mounted substrate that includes an inductor component and a substrate on which the inductor component is mounted. The inductor component includes first and second inductor wiring lines that are arranged inside a magnetic layer and along which a current flows in a common direction between first end portions of the inductor wiring lines that are on one side and second end portions of the inductor wiring lines that are on another side in extension directions of the inductor wiring lines; a first vertical wiring line that is connected to the first end portion of the first inductor wiring line, penetrates through the magnetic layer, and is exposed at an outer surface of the magnetic layer; a second vertical wiring line that is connected to the second end portion of the first inductor wiring line, penetrates through the magnetic layer, and is exposed at the outer surface of the magnetic layer; and a third vertical wiring line that is connected to the first end portion of the second inductor wiring line, penetrates through the magnetic layer, and is exposed at the outer surface of the magnetic layer. The second vertical wiring line is connected to the second end portion of the second inductor wiring line. The substrate includes a first input wiring line to which an input voltage is applied, a second input wiring line to which the input voltage is applied, and an output wiring line to which an output voltage that is lower than the input voltage is applied. The first input wiring line is connected to the first vertical wiring line. The second input wiring line is connected to the third vertical wiring line. The output wiring line is connected to the second vertical wiring line.

According to the above-described embodiments, a shared second vertical wiring line is connected to the second end portions of the inductor wiring lines. Therefore, the number of second vertical wiring lines is smaller than in a case where second vertical wiring lines are individually connected to second end portions of a plurality of inductor wiring lines. Therefore, when designing the inductor component, it is possible to reduce the number of externally exposed second vertical wiring lines, and consequently the degree of freedom of design is increased and there are fewer hindrances to reducing the size of the inductor component.

Another embodiment of the present disclosure provides an inductor component that includes first and second inductor wiring lines that are arranged inside a magnetic layer and along which a current flows in a common direction between first end portions of the inductor wiring lines that are on one side and second end portions of the inductor wiring lines that are on another side in extension directions of the inductor wiring lines; a first vertical wiring line that is connected to the first end portion of the first inductor wiring line, penetrates through the magnetic layer, and is exposed at an outer surface of the magnetic layer; a second vertical wiring line that is connected to the second end portion of the first inductor wiring line, penetrates through the magnetic layer, and that is exposed at the outer surface of the magnetic layer; a third vertical wiring line that is connected to the first end portion of the second inductor wiring line, penetrates through the magnetic layer, and is exposed at the outer surface of the magnetic layer; and a fourth vertical wiring line that is connected to the second end portion of the second inductor wiring line, penetrates through the magnetic layer, and is exposed at the outer surface of the magnetic layer. The inductor component further includes a first outer terminal that is connected to a part of the first vertical wiring line that is exposed at the outer surface of the magnetic layer; a second outer terminal that is connected to a part of the second vertical wiring line that is exposed at the outer surface of the magnetic layer; and a third outer terminal that is connected to a part of the third vertical wiring line that is exposed at the outer surface of the magnetic layer. The second outer terminal is connected to the fourth vertical wiring line.

Another embodiment of the present disclosure provides an inductor component mounted substrate that includes an inductor component; and a substrate on which the inductor component is mounted. The inductor component includes first and second inductor wiring lines that are arranged inside a magnetic layer and along which a current flows in a common direction between first end portions of the inductor wiring lines that are on one side and second end portions of the inductor wiring lines that are on another side in extension directions of the inductor wiring lines; a first vertical wiring line that is connected to the first end portion of the first inductor wiring line, penetrates through the magnetic layer, and is exposed at an outer surface of the magnetic layer; a second vertical wiring line that is connected to the second end portion of the first inductor wiring line, penetrates through the magnetic layer, and is exposed at the outer surface of the magnetic layer; a third vertical wiring line that is connected to the first end portion of the second inductor wiring line, penetrates through the magnetic layer, and is exposed at the outer surface of the magnetic layer; and a fourth vertical wiring line that is connected to the second end portion of the second inductor wiring line, penetrates through the magnetic layer, and is exposed at the outer surface of the magnetic layer. The inductor component further includes a first outer terminal that is connected to a part of the first vertical wiring line that is exposed at the outer surface of the magnetic layer; a second outer terminal that is connected to a part of the second vertical wiring line that is exposed at the outer surface of the magnetic layer; and a third outer terminal that is connected to a part of the third vertical wiring line that is exposed at the outer surface of the magnetic layer. The second outer terminal is connected to the fourth vertical wiring line. The substrate includes a first input wiring line to which an input voltage is applied, a second input wiring line to which the input voltage is applied, and an output wiring line to which an output voltage that is lower than the input voltage is applied. The first input wiring line is connected to the first outer terminal. The second input wiring line is connected to the third outer terminal. The output wiring line is connected to the second outer terminal.

According to the above-described embodiments, a shared second outer terminal is connected to the second vertical wiring line that is connected to the second end portions of the inductor wiring lines. Therefore, the number of second outer terminals is less than in a case where second outer terminals are individually connected to a plurality of second vertical wiring lines. Therefore, when designing the inductor component, it is possible to reduce the number of second outer terminals, and consequently the degree of freedom of design is increased and there are fewer hindrances to reducing the size of the inductor component.

The embodiments of the present disclosure help prevent size reduction of an inductor component from being hindered.

Other features, elements, characteristics and advantages of the present disclosure will become more apparent from the following detailed description of some embodiments of the present disclosure with reference to the attached drawings.

DETAILED DESCRIPTION

Inductor Components According to Embodiments

Figure 1:
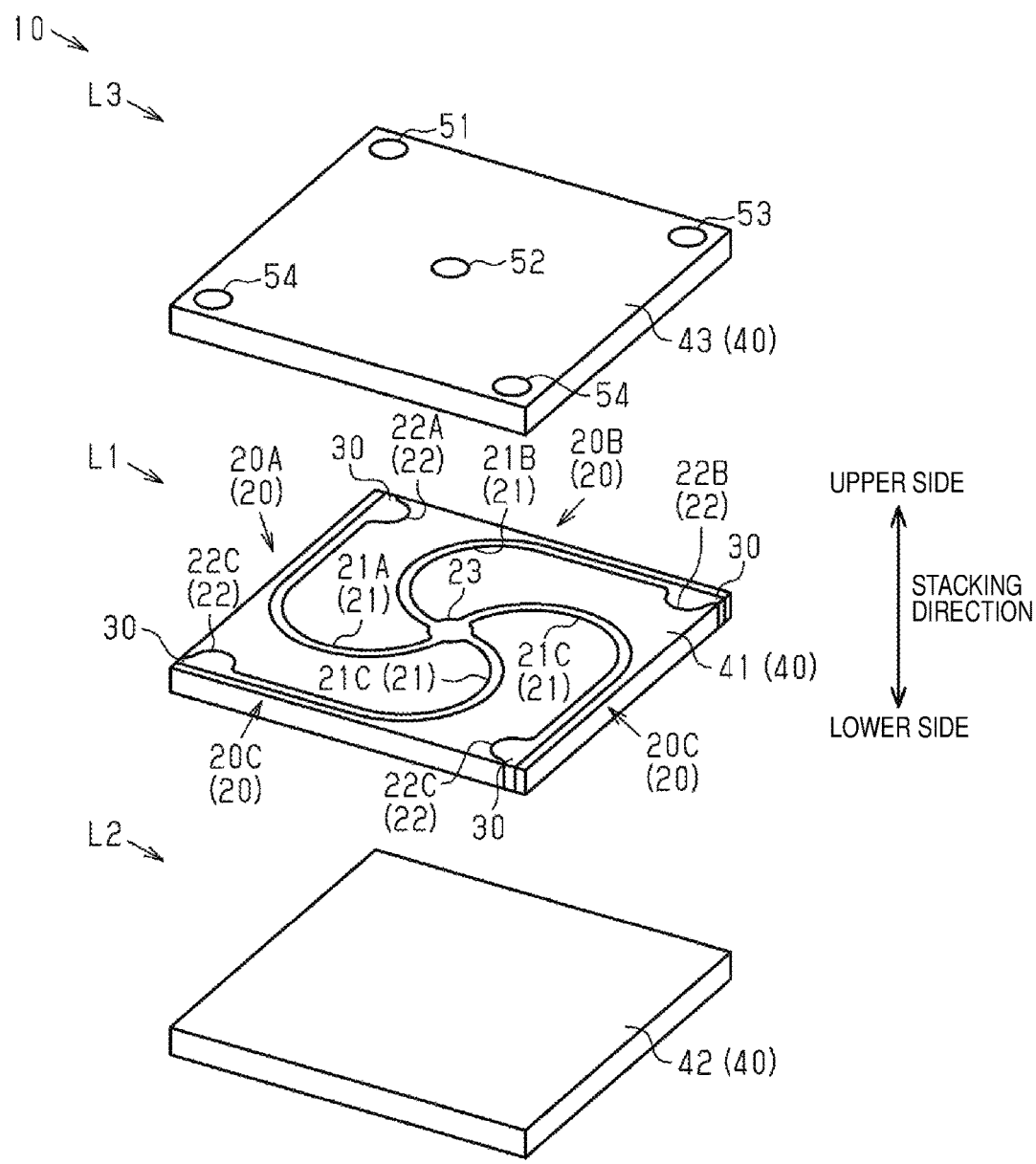
FIG. 1 is an exploded perspective view of an inductor component of a first embodiment.

Hereafter, inductor components according to embodiments of the present disclosure will be described. In the drawings, constituent elements may be illustrated in an enlarged manner for ease of understanding. Dimensional ratios of the constituent elements may differ from the actual ratios or may differ from the ratios in other drawings. Furthermore, hatching is used in the sectional views, but the hatching of some constituent elements may be omitted for ease of understanding.

First Embodiment

Hereafter, an inductor component according to a first embodiment will be described. As illustrated in FIG. 1, an inductor component 10 has an overall structure in which three thin plate-like layers are stacked in a thickness direction. In the following description, a stacking direction in which the three layers are stacked is referred to as an up-down direction. Note that the stacking direction is a direction that is vertical to the plane of the paper in FIG. 2.

A first layer L1 consists of four inductor wiring lines 20, four dummy wiring lines 30, and a first magnetic layer 41. The first layer L1 has a substantially square shape when seen in a plan view. The four inductor wiring lines 20 include a first inductor wiring line 20A, a second inductor wiring line 20B, and two third inductor wiring lines 20C. Furthermore, the inductor wiring lines 20 each include a wiring line body 21 having a substantially constant line width, a first pad 22 that is connected to a first end of the wiring line body 21, and a second pad 23 that is connected to a second end of the wiring line body 21. In this embodiment, the first pad 22 is a first end portion of the inductor wiring line 20 and the second pad 23 is a second end portion of the inductor wiring line 20.

In each inductor wiring line 20, a current flows from the first pad 22 to the second pad 23. In other words, in each inductor wiring line 20, the current flows in a common direction between the first end portion of the inductor wiring line 20 on one side and the second end portion of the inductor wiring line 20 on the other side in the extension direction of the inductor wiring line 20. In this embodiment, in all four inductor wiring lines 20, the current flows from the first end portion to the second end portion.

Figure 2:
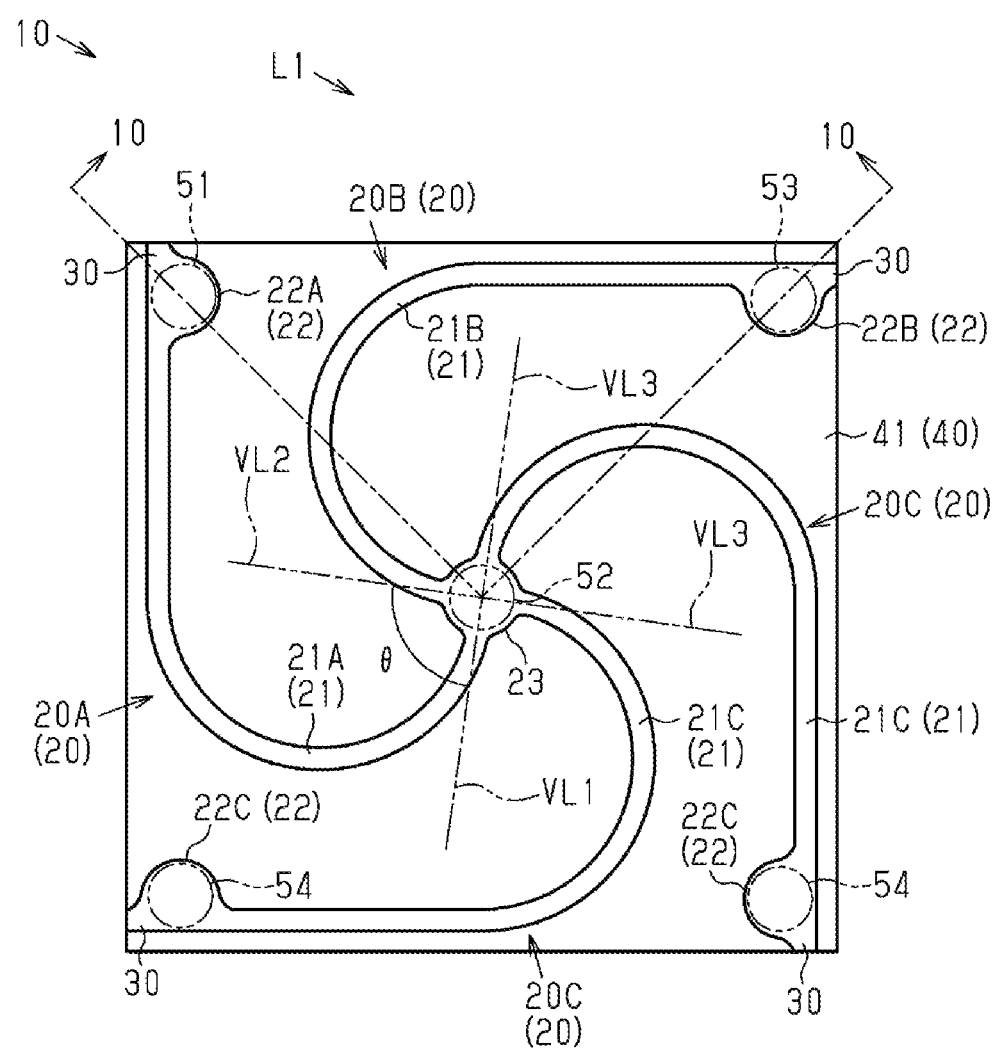
FIG. 2 is a see-through plan view of the inductor component of the first embodiment.

As illustrated in FIG. 2, in the first layer L1, a first wiring line body 21A of the first inductor wiring line 20A extends in a curved manner from the first end near a corner of the substantially square first layer L1 to the second end near the center of the substantially square first layer L1 when seen in a plan view.

A first pad 22A is connected to the first end of the first wiring line body 21A, which is on one side in the extension direction of the first wiring line body 21A. The first pad 22A has a substantially circular shape when seen in a plan view in the up-down direction. The first pad 22A has a larger wiring line width than the first wiring line body 21A connected to the first pad 22A. The first pad 22A is arranged near a corner of the first layer L1, which has a substantially square shape when seen in a plan view.

The second pad 23 is connected to the second end of the first wiring line body 21A, which is on the other side in the extension direction of the first wiring line body 21A. The second pad 23 has a substantially circular shape when seen in a plan view. Note that the wiring line bodies 21 of the four inductor wiring lines 20 all have substantially the same shape, their lengths in the extension directions thereof are identical, the constituent parts of the wiring line bodies 21 are denoted by the same symbols, and repeated description thereof is omitted.

Among the four corners of the first layer L1, which is substantially square shaped in a plan view, the first end of a second wiring line body 21B of the second inductor wiring line 20B is arranged near a corner that is adjacent in a clockwise direction in a plan view to the corner where the first pad 22A of the first inductor wiring line 20A is arranged. In a plan view, the second wiring line body 21B extends in a curved manner from the first end to the second end thereof which is near the center of the substantially square first layer L1.

A first pad 22B is connected to the first end of the first wiring line body 21B, which is on one side in the direction in which the first wiring line body 21B extends. The first pad 22B has a substantially circular shape when seen in a plan view in the up-down direction. The wiring line width of the first pad 22B is larger than that of the second wiring line body 21B connected to the first pad 22B. Among the corners of the first layer L1, which is substantially square shaped in a plan view, the first pad 22B is arranged near a corner that is adjacent in a clockwise direction in a plan view to the corner where the first pad 22A is arranged.

The second pad 23 is connected to the second end of the second wiring line body 21B, which is on the other side in the extension direction of the second wiring line body 21B. In other words, in addition to being the second end portion of the first inductor wiring line 20A, the second pad 23 is also the second end portion of the second inductor wiring line 20B.

Among the four corners of the first layer L1, which is substantially square shaped in a plan view, the first ends of third wiring line bodies 21C of the third inductor wiring lines 20C are arranged near the two remaining corners where the first inductor wiring line 20A and the second inductor wiring line 20B are not arranged. In a plan view, the third wiring line bodies 21C extend in a curved manner from the first ends to the second ends thereof which are near the center of the substantially square shaped first layer L1.

First pads 22C are connected to the first ends of the third wiring line bodies 21C, which are on one side in the extension directions of the third wiring line bodies 21C. The first pads 22C have a substantially circular shape when seen in a plan view in the up-down direction. The wiring line width of the first pads 22C is larger than that of the third wiring line bodies 21C connected to the first pads 22C. The first pads 22C are arranged near corners of the first layer L1, which has a substantially square shape when seen in a plan view.

The second pad 23 is connected to the second ends of the third wiring line bodies 21C, which are on the other side in the extension directions of the third wiring line bodies 21C. In other words, in addition to being the second end portion of the first inductor wiring line 20A, the second pad 23 also forms the second end portions of the two third inductor wiring lines 20C.

The second pad 23 is arranged substantially in the center of the first layer L1, which is substantially square shaped when seen in a plan view. Therefore, in a plan view, the second pad 23, which is the second end portion of each inductor wiring line 20, is located nearer the center of the first layer L1 than the first pads 22 of the inductor wiring lines 20.

The second ends of the four wiring line bodies 21 are connected to the outer edge of the second pad 23. In other words, the second ends of the four wiring line bodies 21 are arranged with a fixed interval therebetween along the outer circumferential surface of the second pad 23. Therefore, in a plan view of the first layer L1, the parts of the four inductor wiring lines 20 near the second ends of the inductor wiring lines 20 extend radially from the second pad 23.

In this case, a first virtual straight line VL1 is a virtual straight line connecting the center of the second pad 23, which is the second end portion of the first inductor wiring line 20A, and the center, in the wiring line width direction, of the second end of the first wiring line body 21A of the first inductor wiring line 20A. Furthermore, a second virtual straight line VL2 is a virtual straight line connecting the center of the second pad 23, which is the second end portion of the second inductor wiring line 20B, and the center, in the wiring line width direction, of the second end of the second wiring line body 21B of the second inductor wiring line 20B. In addition, third virtual straight lines VL3 are virtual straight lines connecting the center of the second pad 23, which is the second end portion of each third inductor wiring line 20C, and the centers, in the wiring line width direction, of the second ends of the third wiring line bodies 21C of the third inductor wiring lines 20C. In this case, a wiring line angle formed between the first virtual straight line VL1 and the second virtual straight line VL2 is 90°. In addition, the angles formed between any two adjacent virtual straight lines are identical and are equal to 90°. In other words, an angular pitch θ between adjacent inductor wiring lines 20 at the radially extending parts of the inductor wiring lines 20 is 90°, and the angular pitch θ is $360/2N<\theta<360/0.5N$ when the number of inductor wiring lines 20 is N.

The number of turns of an inductor wiring line 20 is defined as 1.0 turn when the inductor wiring line 20 extends through 360° with respect to one end of the inductor wiring line 20 when moving from the one end of the inductor wiring line 20 to the other end of the inductor wiring line 20 in the extension direction of the inductor wiring line 20. In other words, the number of turns of the inductor wiring line 20 is represented by a number of times into which the angle through which an inductor wiring line 20 is wound is converted. Thus, for example, if the inductor wiring line 20 is wound through 180°, the number of turns would be 0.5 turns. In this embodiment, the angle through which each inductor wiring line 20 is wound is 180°. Therefore, the number of turns through which each inductor wiring line 20 is wound is 0.5 turns in this embodiment.

The inductor wiring lines 20 are composed of an electrically conductive material, and in this embodiment, the composition of the inductor wiring lines 20 is such that the proportion of copper is 99 wt % or more and the proportion of sulfur is 0.1 wt % or more but less than 1.0 wt % (i.e., from 0.1 wt % to less than 1.0 wt %).

The dummy wiring lines 30 are connected to the first pads 22 of the inductor wiring lines 20. Each dummy wiring line 30 extends, inside the first layer L1, from the part of the first pad 22 on the opposite side from the corresponding wiring line body 21 to the side surface of the first layer L1 and is exposed at the outer surface of the inductor component 10. The material of the dummy wiring lines 30 is the same as that of the inductor wiring lines 20. In other words, the composition of the dummy wiring lines 30 is such that the proportion of copper is 99 wt % or more and the proportion of sulfur is 0.1 wt % or more but less than 1.0 wt % (i.e., from 0.1 wt % to less than 1.0 wt %). Note that the inductor wiring lines 20 and the dummy wiring lines 30 are integrated with each other.

The parts of the first layer L1 other than the inductor wiring lines 20 and the dummy wiring lines 30 are constituted by the first magnetic layer 41. The first magnetic layer 41 is composed of a mixture of a resin and a metal magnetic powder. In other words, the first magnetic layer 41 is composed of a magnetic material. In FIG. 2, a first columnar wiring line 51, a second columnar wiring line 52, a third columnar wiring line 53, and fourth columnar wiring lines 54, which will be described later, are illustrated by double-dot chain lines. In addition, the dimensions of the inductor wiring lines 20 in the stacking direction and the dimensions of the dummy wiring lines 30 in the stacking direction are identical, and the dimensions of the inductor wiring lines 20 in the stacking direction are identical to the dimension of the first layer L1 in the stacking direction.

As illustrated in FIG. 1, a second layer L2 having a substantially square shape in a plan view, the same as the first layer L1, is stacked on the lower surface of the first layer L1. The second layer L2 is a second magnetic layer 42. Therefore, the second magnetic layer 42 is stacked on the lower surfaces of the inductor wiring lines 20. The second magnetic layer 42 is formed of a mixture of a resin and a metal powder, and therefore is formed of a magnetic material similarly to the first magnetic layer 41.

A third layer L3 having a substantially square shape in a plan view, the same as the first layer L1, is stacked on the upper surface of the first layer L1. The third layer L3 consists of the first columnar wiring line 51, the second columnar wiring line 52, the third columnar wiring line 53, two fourth columnar wiring lines 54, and a third magnetic layer 43.

The first columnar wiring line 51 penetrates through the third magnetic layer 43 in the stacking direction and is connected to the upper surface of the first pad 22A of the first inductor wiring line 20A. The material of the first columnar wiring line 51 is the same as that of the first inductor wiring line 20A. In addition, the first columnar wiring line 51 is integrated with the first inductor wiring line 20A. The first columnar wiring line 51 has a substantially cylindrical shape and the axial direction of the cylindrical shape is the same as the stacking direction. The dimension of the first columnar wiring line 51 in the stacking direction is identical to the dimension of the third layer L3 in the stacking direction. Therefore, the upper surface of the first columnar wiring line 51 is exposed at the upper surface of the third layer L3. In a plan view, the diameter of the substantially circular first columnar wiring line 51 is slightly smaller than the diameter of the first pad 22A. In this embodiment, the first columnar wiring line 51 is a first vertical wiring line.

The third columnar wiring line 53 penetrates through the third magnetic layer 43 in the stacking direction and is connected to the upper surface of the first pad 22B of the second inductor wiring line 20B. The material of the third columnar wiring line 53 is the same as that of the second inductor wiring line 20B. In addition, the third columnar wiring line 53 is integrated with the second inductor wiring line 20B. The third columnar wiring line 53 has a substantially cylindrical shape and the axial direction of the cylindrical shape is the same as the stacking direction. The dimension of the third columnar wiring line 53 in the stacking direction is identical to the dimension of the third layer L3 in the stacking direction. Therefore, the upper surface of the third columnar wiring line 53 is exposed at the upper surface of the third layer L3. In a plan view, the diameter of the substantially circular third columnar wiring line 53 is slightly smaller than the diameter of the first pad 22B. In this embodiment, the third columnar wiring line 53 is a third vertical wiring line.

The fourth columnar wiring lines 54 penetrate through the third magnetic layer 43 in the stacking direction and are connected to the upper surfaces of the first pads 22C of the third inductor wiring lines 20C. The material of the fourth columnar wiring lines 54 is the same as that of the third inductor wiring lines 20C. In addition, the fourth columnar wiring lines 54 are integrated with the third inductor wiring lines 20C. The fourth columnar wiring lines 54 each have a substantially cylindrical shape and the axial direction of the cylindrical shape is the same as the stacking direction. In this embodiment, the fourth columnar wiring lines 54 are each a fourth vertical wiring line. Note that one fourth columnar wiring line 54 is arranged on the upper side of each of the two first pads 22C.

The second columnar wiring line 52 penetrates through the third magnetic layer 43 in the stacking direction and is connected to the upper surface of the second pad 23. The material of the second columnar wiring line 52 is the same as that of the first inductor wiring line 20A. The second columnar wiring line 52 has a substantially cylindrical shape and the axial direction of the cylindrical shape is the same as the stacking direction. The dimension of the second columnar wiring line 52 in the stacking direction is identical to the dimension of the third layer L3 in the stacking direction. Therefore, the upper surface of the second columnar wiring line 52 is exposed at the upper surface of the third layer L3. In a plan view, the diameter of the substantially circular second columnar wiring line 52 is slightly smaller than the diameter of the second pad 23. In this embodiment, the second columnar wiring line 52 is a second vertical wiring line.

As described above, the second pad 23 is the second end portion of the first inductor wiring line 20A, and additionally is the second end portion of the second inductor wiring line 20B and the second end portions of the third inductor wiring lines 20C. Therefore, the second columnar wiring line 52 is connected to the second pad 23, which is the second end portions of four inductor wiring lines 20.

The parts of the third layer L3 other than the first columnar wiring line 51, the second columnar wiring line 52, the third columnar wiring line 53, and the fourth columnar wiring lines 54 consist of the third magnetic layer 43. Therefore, the third magnetic layer 43 is stacked on the upper surfaces of the inductor wiring lines 20. The third magnetic layer 43 is formed of a mixture of a resin and a metal magnetic powder, and therefore is formed of a magnetic material similarly to the first magnetic layer 41 and the second magnetic layer 42 described above.

In the inductor component 10, a magnetic layer 40 is formed by the first magnetic layer 41, the second magnetic layer 42, and the third magnetic layer 43. The first magnetic layer 41, the second magnetic layer 42, the third magnetic layer 43 are connected to each other and surround the inductor wiring lines 20. Thus, the magnetic layer 40 forms a closed magnetic path with respect to the inductor wiring lines 20. Note that the first magnetic layer 41, the second magnetic layer 42, and the third magnetic layer 43 are illustrated as being separate from each other, but are in fact integrated with each other in the form of the magnetic layer 40.

Next, the operations and effects of the above-described first embodiment will be described.

(1) According to the above-described first embodiment, the second pad 23, which is the second end portion of the first inductor wiring line 20A, is also the second end portion of the second inductor wiring line 20B. A single second columnar wiring line 52 is connected to the second pad 23. Therefore, the number of vertical wiring lines is reduced compared with a case where individual vertical wiring lines are connected to the second end portions of the four inductor wiring lines 20. Therefore, when designing the inductor component 10, it is possible to reduce the number of externally exposed vertical wiring lines, and consequently the degree of freedom of design is increased and for example there are fewer hindrances to reducing the size of the inductor component 10.

(2) According to the above-described first embodiment, the entirety of inductor wiring lines 20 including not only the wiring line bodies 21 but also the second pad 23 are arranged inside the same first layer L1. As a result, compared with the case where the inductor wiring lines 20 are arranged in different layers, the dimension of the inductor component 10 as a whole in the stacking direction can be reduced.

(3) According to the above-described first embodiment, the lengths of the wiring line bodies 21 of the inductor wiring lines 20 are identical. Therefore, the inductances obtained from the individual inductor wiring lines 20 when the same current flows are easily matched. In addition, similarly, since the lengths of the wiring line bodies 21 of the inductor wiring lines 20 are identical, the direct current electrical resistances of the inductor wiring lines 20 are easily matched.

(4) According to the above-described first embodiment, the number of turns of each inductor wiring line 20 is less than 1.0 turns. Therefore, the direct-current resistances of the inductor wiring lines 20 can be reduced, and therefore comparatively large currents can flow through the inductor wiring lines 20. In addition, since the number of turns of each inductor wiring line 20 is small, the ratio of the volume of the inductor wiring lines 20 to the volume of the entire inductor component 10 can be reduced. Therefore, reduction of the acquisition ratio of inductance relative to the volume of the entire inductor component 10 is unlikely to be hindered due to the ratio of the volume of the magnetic layer 40 to the volume of the entire inductor component 10 being relatively large.

Second Embodiment

Hereafter, an inductor component according to a second embodiment will be described. The second embodiment described hereafter mainly differs from the inductor component 10 of the first embodiment with respect to the shapes and arrangements of the inductor wiring lines. Note that the stacking direction is a direction that is vertical to the plane of the paper in FIG. 4.

Figure 3:
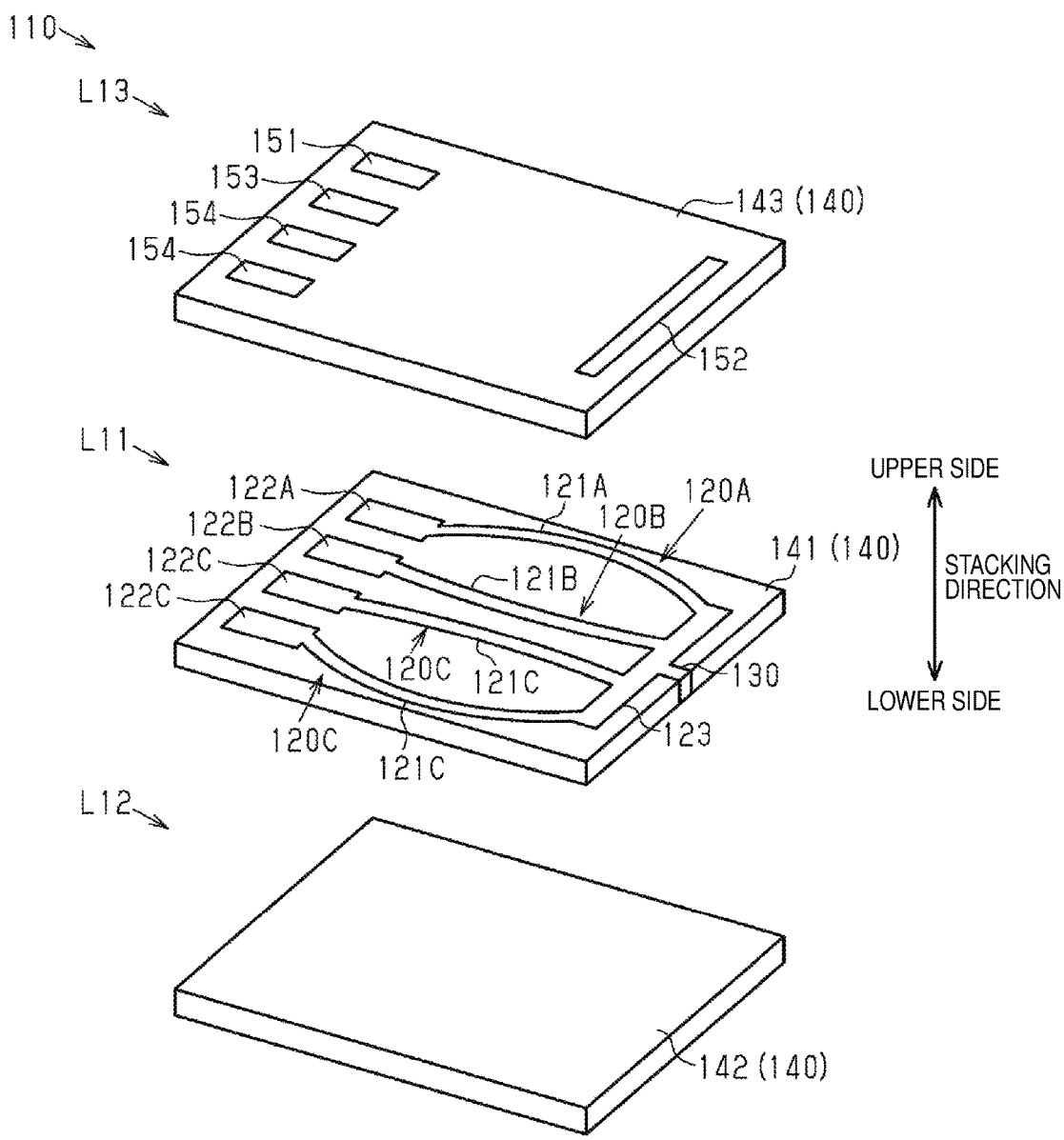
FIG. 3 is an exploded perspective view of an inductor component of a second embodiment.

As illustrated in FIG. 3, an inductor component 110 has an overall structure in which three thin plate-like layers are stacked in a thickness direction. In the following description, a stacking direction in which the three layers are stacked is referred to as an up-down direction.

Figure 4:
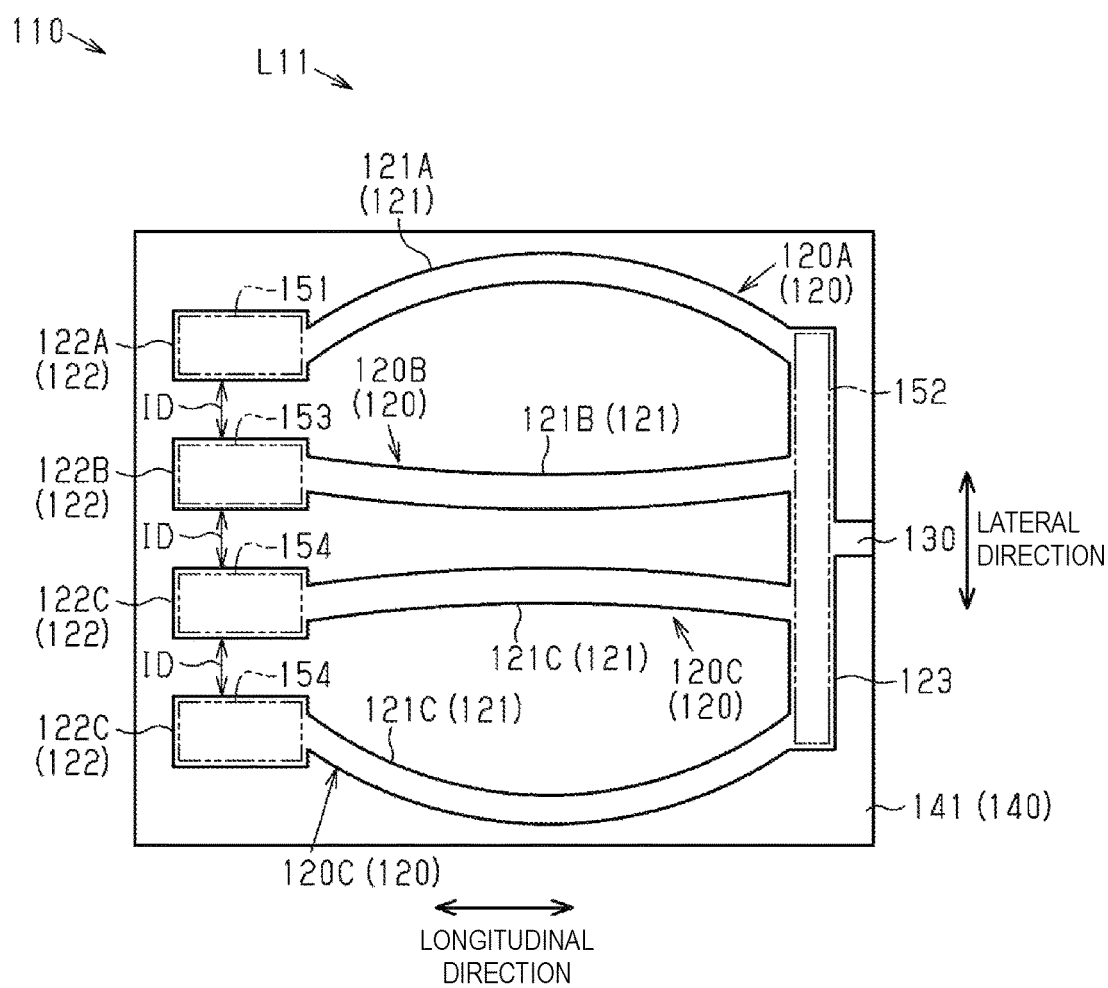
FIG. 4 is a see-through plan view of the inductor component of the second embodiment.

As illustrated in FIG. 4, a first layer L11 consists of four inductor wiring lines 120, one dummy wiring line 130, and a first magnetic layer 141. The first layer L11 has a substantially rectangular shape when seen in a plan view. The four inductor wiring lines 120 include a first inductor wiring line 120A, a second inductor wiring line 120B, and two third inductor wiring lines 120C. The inductor wiring lines 120 each include a wiring line body 121 having a substantially constant line width, a first pad 122 that is connected to a first end of the wiring line body 121, and a second pad 123 that is connected to a second end of the wiring line body 121. In this embodiment, the first pad 122 is a first end portion of the inductor wiring line 120 and the second pad 123 is a second end portion of the inductor wiring line 120.

In each inductor wiring line 120, a current flows from the first pad 122 to the second pad 123. In other words, in each inductor wiring line 120, the current flows in a common direction between the first end portion of the inductor wiring line 120 on one side and the second end portion of the inductor wiring line 120 on the other side in the extension direction of the inductor wiring line 120. In this embodiment as well, similarly to as in the above-described first embodiment, the current flows from the first end portion to the second end portion in all four inductor wiring lines 120.

In the first layer L11, the wiring line bodies 121 of the inductor wiring lines 120 extend in the longitudinal direction of the substantially rectangular first layer L11 on the whole when seen in a plan view. The wiring line bodies 121 of the inductor wiring lines 120 are arrayed in the lateral direction of the substantially rectangular first layer L11.

A first wiring line body 121A of the first inductor wiring line 120A is arranged at one side in the lateral direction of the substantially rectangular first layer L11 when seen in a plan view. The first wiring line body 121A curves in convex manner toward the outside in the lateral direction of the substantially rectangular first layer L11.

A first pad 122A is connected to the first end of the first wiring line body 121A, which is on one side in the extension direction of the first wiring line body 121A. The first pad 122A has a substantially rectangular shape when seen in a plan view in the up-down direction. The second pad 123 is connected to the second end of the first wiring line body 121A which is on the other side in the extension direction of the first wiring line body 121A. The second pad 123 has a substantially rectangular shape that is elongated in the lateral direction of the first layer L11 when seen in a plan view in the up-down direction.

A second wiring line body 121B of the second inductor wiring line 120B is arranged nearer the center in the lateral direction of the substantially rectangular first layer L11 than the first wiring line body 121A of the first inductor wiring line 120A when seen in a plan view. The second wiring line body 121B curves in a convex manner toward the inside in the lateral direction of the substantially rectangular first layer L11. The second wiring line body 121B has a larger radius of curvature than the first wiring line body 121A. As a result, the length of the second wiring line body 121B is smaller than the length of the first wiring line body 121A.

A first pad 122B is connected to the first end of the second wiring line body 121B, which is on one side in the extension direction of the second wiring line body 121B. The first pad 122B has a substantially rectangular shape when seen in a plan view in the up-down direction. The second pad 123 is connected to the second end of the second wiring line body 121B which is on the other side in the extension direction of the second wiring line body 121B. In other words, in addition to being the second end portion of the first inductor wiring line 120A, the second pad 123 is also the second end portion of the second inductor wiring line 120B.

The two third inductor wiring lines 120C are arranged on the other side of the center of the substantially rectangular first layer L11 in the lateral direction when seen in a plan view. third wiring line bodies 121C of the two third inductor wiring lines 120C have line symmetrical shapes with the first wiring line body 121A and the second wiring line body 121B about an axis of symmetry at the center of the substantially rectangular first layer L11 in the lateral direction. In other words, the third wiring line body 121C that is nearer the center in the lateral direction of the substantially rectangular first layer L11 curves in a convex manner toward the inside in the lateral direction of the substantially rectangular first layer L11. On the other hand, the third wiring line body 121C that is nearer the outside in the lateral direction of the substantially rectangular first layer L11 curves in a convex manner toward the outside in the lateral direction of the substantially rectangular first layer L11.

First pads 122C are connected to the first ends of the third wiring line bodies 121C, which are on one side in the extension direction of the third wiring line bodies 121C. The first pads 122C have a substantially rectangular shape when seen in a plan view in the up-down direction. On the other hand, the second pad 123 is connected to the second ends of the two third wiring line bodies 121C, which are on the other side in the extension directions of the third wiring line bodies 121C. In other words, in addition to being the second end portion of the first inductor wiring line 120A, the second pad 123 is also the second end portions of the two third inductor wiring lines 120C. The first pads 122 are spaced apart from each other.

The number of turns of each inductor wiring line 120 is less than 1.0 turns. Furthermore, the inductor wiring lines 120 are composed of an electrically conductive material, and in this embodiment, the composition of the inductor wiring lines 120 is such that the proportion of copper is 99 wt % or more and the proportion of sulfur is 0.1 wt % or more but less than 1.0 wt % (i.e., from 0.1 wt % to less than 1.0 wt %).

From the center of the second pad 123 in the extension direction of the second pad 123, that is, the center of the first layer L11 in the lateral direction of the first layer L11, the dummy wiring line 130 extends to the side of the first layer L11 and is exposed at the outer surface of the inductor component 110. The material of the dummy wiring line 130 is the same as that of the inductor wiring lines 120. The dummy wiring line 130 is integrated with the four inductor wiring lines 120.

The parts of the first layer L11 other than the inductor wiring lines 120 and the dummy wiring line 130 are constituted by the first magnetic layer 141. The first magnetic layer 141 is composed of a mixture of a resin and a metal magnetic powder. In other words, the first magnetic layer 141 is composed of a magnetic material. In FIG. 4, a first columnar wiring line 151, a second columnar wiring line 152, a third columnar wiring line 153, and fourth columnar wiring lines 154, which will be described later, are illustrated by double-dot chain lines. In addition, the dimensions of the inductor wiring lines 120 in the stacking direction and the dimension of the dummy wiring line 130 in the stacking direction are identical, and the dimensions of the inductor wiring lines 120 in the stacking direction are identical to the dimension of the first layer L11 in the stacking direction.

In the first layer L11, a first inter pad distance ID, which is the smallest distance between the first pads 122, is at least 40 times the average particle diameter of the metal magnetic powder that constitutes the first magnetic layer 141. The average particle size of the metal magnetic powder is measured using a scanning electron microscope (SEM) image of a cross section of the magnetic layer 140 in the inductor component 110. Specifically, the area of each metal magnetic powder particle is measured in an SEM image at a magnification where fifteen or more metal magnetic powder particles can be seen, the circle equivalent diameter is calculated from $(4/\pi \times (area))^{1/2}$, and the arithmetic mean value is used as the average particle diameter of the metal magnetic powder. At the raw material stage, the average particle diameter of the metal magnetic powder is measured by laser diffraction and scattering with the metal magnetic powder in a raw material state. The average particle diameter of the metallic magnetic powder is defined as the particle diameter corresponding to an integrated value of 50% in a particle size distribution obtained by laser diffraction and scattering.

As illustrated in FIG. 3, a second layer L12 having a substantially rectangular shape in a plan view, the same as the first layer L11, is stacked on the lower surface of the first layer L11. The second layer L12 is a second magnetic layer 142. Therefore, the second magnetic layer 142 is stacked on the lower surfaces of the inductor wiring lines 120. The second magnetic layer 142 is composed of a mixture of a resin and a metal powder and is therefore composed of a magnetic material similarly to the first magnetic layer 141.

A third layer L13 having a substantially rectangular shape in a plan view, the same as the first layer L11, is stacked on the upper surface of the first layer L11. The third layer L13 consists of the first columnar wiring line 151, the second columnar wiring line 152, the third columnar wiring line 153, the two fourth columnar wiring lines 154, and a third magnetic layer 143.

The first columnar wiring line 151 penetrates through the third magnetic layer 143 in the stacking direction and is connected to the upper surface of the first pad 122A of the first inductor wiring line 120A. The material of the first columnar wiring line 151 is the same as that of the first inductor wiring line 120A. In addition, the first columnar wiring line 151 is integrated with the first inductor wiring line 120A. The first columnar wiring line 151 has a substantially prismatic shape and the axial direction of the prismatic shape is the same as the stacking direction. The dimension of the first columnar wiring line 151 in the stacking direction is identical to the dimension of the third layer L13 in the stacking direction. Therefore, the upper surface of the first columnar wiring line 151 is exposed at the upper surface of the third layer L13. In a plan view, the size of the substantially rectangular first columnar wiring line 151 is slightly smaller than the size of the substantially rectangular first pad 122A. In this embodiment, the first columnar wiring line 151 is a first vertical wiring line.

The third columnar wiring line 153 penetrates through the third magnetic layer 143 in the stacking direction and is connected to the upper surface of the first pad 122B of the second inductor wiring line 120B. The material of the third columnar wiring line 153 is the same as that of the second inductor wiring line 120B. In addition, the third columnar wiring line 153 is integrated with the second inductor wiring line 120B. The third columnar wiring line 153 has a substantially prismatic shape and the axial direction of the prismatic shape is the same as the stacking direction. The dimension of the third columnar wiring line 153 in the stacking direction is identical to the dimension of the third layer L13 in the stacking direction. Therefore, the upper surface of the third columnar wiring line 153 is exposed at the upper surface of the third layer L13. In a plan view, the size of the substantially rectangular third columnar wiring line 153 is slightly smaller than the size of the substantially rectangular first pad 122B. In this embodiment, the second columnar wiring line 152 is a second vertical wiring line.

The fourth columnar wiring lines 154 penetrate through the third magnetic layer 143 in the stacking direction and are connected to the upper surfaces of the first pads 122C of the third inductor wiring lines 120C. The material of the fourth columnar wiring lines 154 is the same as that of the third inductor wiring lines 120C. In addition, the fourth columnar wiring lines 154 are integrated with the third inductor wiring lines 120C. The fourth columnar wiring lines 154 have a substantially prismatic shape and the axial direction of the prismatic shape is the same as the stacking direction. The dimensions of the fourth columnar wiring lines 154 in the stacking direction are identical to the dimension of the third layer L13 in the stacking direction. Therefore, the upper surfaces of the fourth columnar wiring lines 154 are exposed at the upper surface of the third layer L13. In a plan view, the sizes of the substantially rectangular fourth columnar wiring lines 154 are slightly smaller than the sizes of the substantially rectangular first pads 122C. In this embodiment, the fourth columnar wiring lines 154 are fourth vertical wiring lines. Note that one fourth columnar wiring line 154 is arranged on the upper side of each of the two first pads 122C.

The second columnar wiring line 152 penetrates through the third magnetic layer 143 in the stacking direction and is connected to the upper surface of the second pad 123. The material of the second columnar wiring line 152 is the same as that of the first inductor wiring line 120A. In addition, the second columnar wiring line is integrated with each inductor wiring lines 120. The second columnar wiring line has a substantially prismatic shape and the axial direction of the prismatic shape is the same as the stacking direction. The dimension of the second columnar wiring line 152 in the stacking direction is identical to the dimension of the third layer L13 in the stacking direction. Therefore, the upper surface of the second columnar wiring line 152 is exposed at the upper surface of the third layer L13. In a plan view, the size of the substantially rectangular second columnar wiring line 152 is slightly smaller than the size of the substantially rectangular second pad 123. In this embodiment, the second columnar wiring line 152 is a second vertical wiring line.

As described above, the second pad 123 is the second end portion of the first inductor wiring line 120A, and additionally is the second end portion of the second inductor wiring line 120B and the second end portions of the third inductor wiring lines 120C. Therefore, the second columnar wiring line 152 is connected to the second pad 123, which is the second end portions of four inductor wiring lines 120.

The parts of the third layer L13 other than the first columnar wiring line 151, the second columnar wiring line 152, the third columnar wiring line 153, and the fourth columnar wiring lines 154 consist of the third magnetic layer 143. Therefore, the third magnetic layer 143 is stacked on the upper surfaces of the inductor wiring lines 120. The third magnetic layer 143 is composed of a mixture of a resin and a metal magnetic powder and is therefore composed of a magnetic material similarly to the first magnetic layer 141 and the second magnetic layer 142 described above.

In the inductor component 110, a magnetic layer 140 is formed by the first magnetic layer 141, the second magnetic layer 142, and the third magnetic layer 143. The first magnetic layer 141, the second magnetic layer 142, the third magnetic layer 143 are connected to each other and surround the inductor wiring lines 120. Thus, the magnetic layer 140 forms a closed magnetic path with respect to the inductor wiring lines 120. Note that the first magnetic layer 141, the second magnetic layer 142, and the third magnetic layer 143 are illustrated as being separate from each other, but are in fact integrated with each other in the form of the magnetic layer 140.

Next, the operations and effects of the above-described second embodiment will be described. In addition to the effects (1), (2), and (4) of the first embodiment described above, the second embodiment also exhibits the following effects.

(5) According to the second embodiment, the length of the first wiring line body 121A of the first inductor wiring line 120A and the length of the second wiring line body 121B of the second inductor wiring line 120B are different from each other. Therefore, for example, it is possible to switch the inductance that is obtained by providing switching elements or the like each upstream of the four columnar wiring lines 151, 153, and 154 of the inductor component 110 thereby making it possible to select the inductor wiring line 120 to which the current flows.

(6) According to the second embodiment, the first inter pad distance ID, which is the smallest distance between the first pads 122 of the inductor wiring lines 120, is at least 40 times the average particle diameter of the metal magnetic powder constituting the first magnetic layer 141. If the first inter pad distance ID is excessively small, there is a risk of the first pads 122 being short circuited via particles of the metal magnetic powder between the first pads 122. According to the second embodiment, the first inter pad distance ID between the first pads 122 can be said to be sufficiently large compared with the size of the particle diameter of the metal magnetic powder. Therefore, it is easy to prevent a short circuit between two first pads 122.

Third Embodiment

Hereafter, an inductor component according to a third embodiment will be described. The third embodiment described hereafter mainly differs from the inductor component 10 of the first embodiment with respect to the shapes and arrangements of the inductor wiring lines. In particular, the layers in which the inductor wiring lines are arranged are different.

Figure 5:
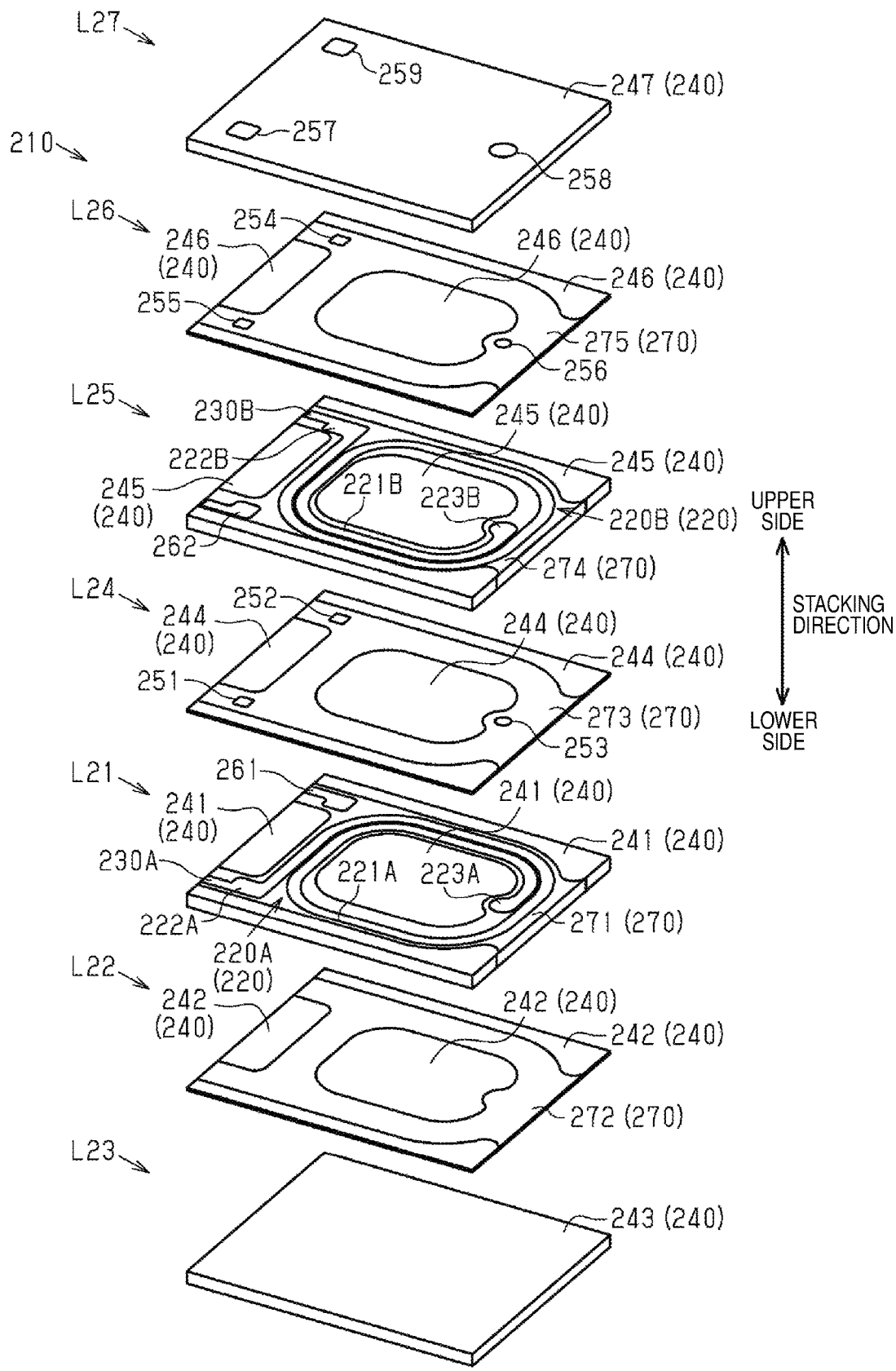
FIG. 5 is an exploded perspective view of an inductor component of a third embodiment.

As illustrated in FIG. 5, an inductor component 210 has an overall structure in which seven thin plate-like layers are stacked in a thickness direction. In the following description, a stacking direction in which the seven layers are stacked is referred to as an up-down direction. Note that the stacking direction is a direction that is vertical to the plane of the paper in FIG. 6.

A first layer L21 consists of a first inductor wiring line 220A, a dummy wiring line 230A, a first layer connection wiring line 261, a first insulating portion 271, and a first magnetic layer 241. The first layer L21 has a substantially rectangular shape when seen in a plan view. The first inductor wiring line 220A includes a first wiring line body 221A having a substantially constant line width, a first pad 222A that is connected to a first end of the first wiring line body 221A, and a second pad 223A that is connected to a second end of the first wiring line body 221A. In this embodiment, the first pad 222A is a first end portion of the first inductor wiring line 220A and the second pad 223A is a second end portion of the first inductor wiring line 220A.

The current flows between the first end portion on one side and the second end portion on the other side of the first inductor wiring line 220A in the extension direction of the first inductor wiring line 220A. In this embodiment, the current flows from the first pad 222A to the second pad 223A in the first inductor wiring line 220A. In other words, the current flows from the first end portion to the second end portion of the first inductor wiring line 220A.

Figure 6:
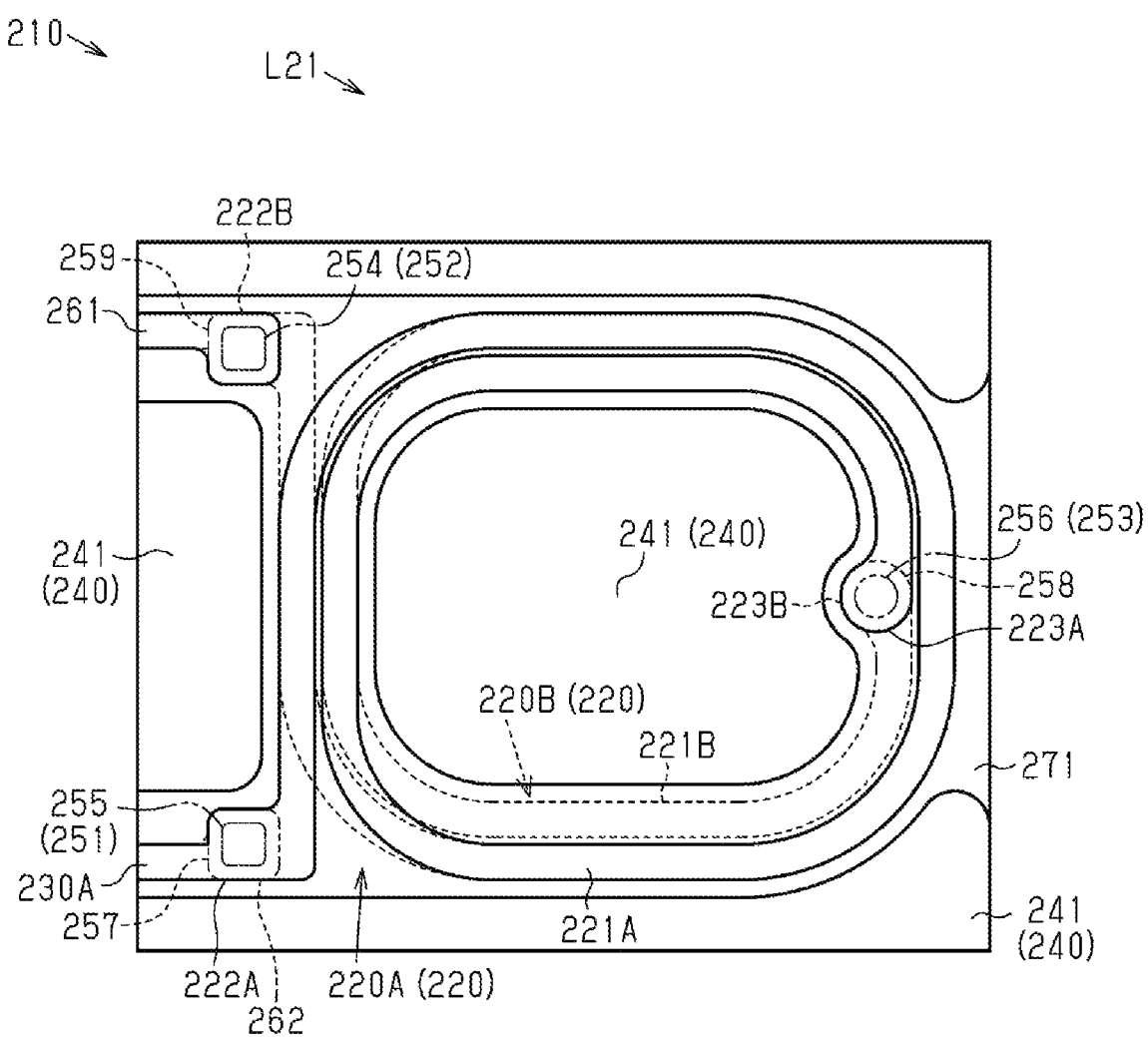
FIG. 6 is a see-through plan view of the inductor component of the third embodiment.

As illustrated in FIG. 6, in the first layer L21, the first wiring line body 221A of the first inductor wiring line 220A extends in a substantially spiral shape centered on a region near the center of the rectangular shape of the first layer L21 in a plan view. Specifically, the first wiring line body 221A of the first inductor wiring line 220A is wound in a substantially spiral shape in the clockwise direction from the first end thereof that is on the outside in a radial direction to the second end thereof that is on the inside in the radial direction.

In the present embodiment, the angle through which the first inductor wiring line 220A is wound is 540°. Therefore, the number of turns through which the first inductor wiring line 220A is wound is 1.5 turns in this embodiment. In addition, in this embodiment, in a plan view of the first layer L21, the side where the first end of the first wiring line body 221A is arranged in the longitudinal direction of the substantially rectangular first layer L21 is referred to as a first end side and the side where the second end of the first wiring line body 221A is arranged in the longitudinal direction of the substantially rectangular first layer L21 is referred to as a second end side.

The first inductor wiring line 220A is composed of an electrically conductive material, and in this embodiment, the composition of the first inductor wiring line 220A is such that the proportion of copper is 99 wt % or more and the proportion of sulfur is 0.1 wt % or more but less than 1.0 wt % (i.e., from 0.1 wt % to less than 1.0 wt %).

The first pad 222A is connected to the first end of the first wiring line body 221A, which is on one side in the extension direction of the first wiring line body 221A. The first pad 222A has a substantially rectangular shape in a plan view. The first pad 222A forms the first end portion of the first inductor wiring line 220A. The first pad 222A is arranged near a corner of the first layer L21 which has a substantially rectangular shape in a plan view. The first pad 222A has a larger wiring line width than the first wiring line body 221A connected to the first pad 222A.

The second pad 223A is connected to the second end of the first wiring line body 221A, which is on the other side in the extension direction of the first wiring line body 221A. The second pad 223A has a substantially circular shape in a plan view. The second pad 223A forms the second end portion of the first inductor wiring line 220A. The second pad 223A has a larger wiring line width than the first wiring line body 221A connected to the second pad 223A.

The dummy wiring line 230A is connected to the first pad 222A. The dummy wiring line 230A extends from the part of the first pad 222A on the opposite side from the first wiring line body 221A to the side surface of the first layer L21 and is exposed at the outer surface of the inductor component 210. The material of the dummy wiring line 230A is identical to that of the first inductor wiring line 220A. The first inductor wiring line 220A and the dummy wiring line 230A are integrated with each other.

In a plan view, the first layer connection wiring line 261 is arranged near the corner of the first layer L21 on the opposite side from the first pad 222A in the lateral direction of the substantially rectangular first layer L21 and on the first end side in the longitudinal direction. The first layer connection wiring line 261 has substantially the same shape as the first pad 222A and the dummy wiring line 230A and has line symmetry with the first pad 222A and the dummy wiring line 230A about an axis of symmetry that is a straight line passing through the center of the first layer L21 in the lateral direction and extending in the longitudinal direction of the first layer L21. The first layer connection wiring line 261 is composed of the same material as the first inductor wiring line 220A.

In the first layer L21, the side surfaces of the first inductor wiring line 220A, the side surfaces of the dummy wiring line 230A, and the side surfaces of the first layer connection wiring line 261 are covered by the first insulating portion 271. In other words, the first inductor wiring line 220A, the dummy wiring line 230A, and the first layer connection wiring line 261 are surrounded by the first insulating portion 271. The first insulating portion 271 is composed of an insulating resin having an insulating property, and the first insulating portion 271 has a higher insulating property than the first inductor wiring line 220A. The parts of the first layer L21 other than the first inductor wiring line 220A, the first layer connection wiring line 261, and the first insulating portion 271 consist of the first magnetic layer 241. Therefore, the first magnetic layer 241 is arranged in the center part of the first layer L21, in the two end parts of the first layer L21 in the lateral direction, and in the part of the first layer L21 on the first end side in the longitudinal direction.

The first magnetic layer 241 is composed of a mixture of a resin and a metal magnetic powder. Therefore, the first magnetic layer 241 is composed of a magnetic material. In addition, in FIG. 6, a first columnar wiring line 257, a second columnar wiring line 258, a first via 251, a second via 252, a third via 253, a fourth via 254, a fifth via 255, and a sixth via 256, which will be described later, are illustrated by double-dot chain lines. Furthermore, a second inductor wiring line 220B and a fifth layer connection wiring line 262, which will be described later, are illustrated by broken lines.

As illustrated in FIG. 5, a second layer L22 having a substantially rectangular shape in a plan view, the same as the first layer L21, is stacked on the lower surface of the first layer L21. The second layer L22 consists of a second insulating portion 272 and a second magnetic layer 242. Therefore, the second magnetic layer 242 is stacked on the lower surface of the first inductor wiring line 220A.

The second insulating portion 272 covers the first inductor wiring line 220A, the dummy wiring line 230A, and the first layer connection wiring line 261 from below. In other words, the second insulating portion 272 entirely covers the lower surfaces of the electrically conductive wiring line parts of the first layer L21. The second insulating portion 272 is composed of an insulating resin having an insulating property the same as the first insulating portion 271, and the second insulating portion 272 has a higher insulating property than the first inductor wiring line 220A.

The parts of the second layer L22 other than the second insulating portion 272 consist of the second magnetic layer 242. Therefore, the second magnetic layer 242 is arranged in the center part of the second layer L22, in the two end parts of the second layer L22 in the lateral direction, and in the part of the second layer L22 on the first end side in the longitudinal direction. The second magnetic layer 242 is composed of a mixture of a resin and a metal magnetic powder and is therefore composed of a magnetic material similarly to the first magnetic layer 241 described above.

A third layer L23 having a substantially rectangular shape in a plan view, the same as the first layer L21, is stacked on the lower surface of the second layer L22. The third layer L23 is a third magnetic layer 243. Therefore, the third magnetic layer 243 is stacked on the lower surface of the first inductor wiring line 220A. The third magnetic layer 243 is composed of a mixture of a resin and a metal magnetic powder and is therefore composed of a magnetic material similarly to the first magnetic layer 241 described above.

A fourth layer L24 having a substantially rectangular shape in a plan view, the same as the first layer L21, is stacked on the upper surface of the first layer L21. The fourth layer L24 consists of a third insulating portion 273, the first via 251, the second via 252, the third via 253, and a fourth magnetic layer 244. The first via 251, the second via 252, and the third via 253 penetrate through the fourth magnetic layer 244 in the stacking direction.

The first via 251 is arranged on the upper side of the first pad 222A of the first layer L21 and is connected to the first pad 222A. The second via 252 is arranged on the upper side of the first layer connection wiring line 261 of the first layer L21 and is connected to the first layer connection wiring line 261. The third via 253 is arranged on the upper side of the second pad 223A of the first layer L21 and is connected to the second pad 223A. The first via 251, the second via 252, and the third via 253 have substantially columnar shapes and the axial directions thereof are the same as the stacking direction. The dimensions of the first via 251, the second via 252, and the third via 253 in the stacking direction are identical to the dimension of the fourth layer L24 in the stacking direction. Therefore, the first via 251, the second via 252, and the third via 253 penetrate through the fourth layer L24 in the stacking direction.

The third insulating portion 273 covers the first inductor wiring line 220A, the dummy wiring line 230A, the first layer connection wiring line 261, and the first insulating portion 271 from above. In other words, the third insulating portion 273 entirely covers the upper surfaces of the wiring lines arranged in the first layer L21 except for the parts thereof where the first via 251, the second via 252, and the third via 253 are arranged. In a plan view, the third insulating portion 273 is shaped so as to cover a slightly wider area than the outer edges of the first inductor wiring line 220A, the dummy wiring line 230A, and the first layer connection wiring line 261. Therefore, the shape of the third insulating portion 273 is similar to the shape of the second insulating portion 272 except for the places where the first via 251, the second via 252, and the third via 253 are arranged. The third insulating portion 273 is composed of an insulating resin having an insulating property the same as the first insulating portion 271, and the third insulating portion 273 has a higher insulating property than the first inductor wiring line 220A.

The parts of the fourth layer L24 other than the first via 251, the second via 252, the third via 253, and the third insulating portion 273 consist of the fourth magnetic layer 244. Therefore, the fourth magnetic layer 244 is arranged in the center part of the fourth layer L24, in the two end parts of the fourth layer L24 in the lateral direction, and in the part of the fourth layer L24 on the first end side in the longitudinal direction. The fourth magnetic layer 244 is composed of a mixture of a resin and a metal magnetic powder and is therefore composed of a magnetic material similarly to the first magnetic layer 241 described above.

A fifth layer L25 having a substantially rectangular shape in a plan view, the same as the first layer L21, is stacked on the upper surface of the fourth layer L24. The fifth layer L25 consists of the second inductor wiring line 220B, a dummy wiring line 230B, the fifth layer connection wiring line 262, a fourth insulating portion 274, and a fifth magnetic layer 245. The second inductor wiring line 220B includes a second wiring line body 221B having a substantially constant line width, a first pad 222B that is connected to a first end of the second wiring line body 221B, and a second pad 223B that is connected to a second end of the second wiring line body 221B. In this embodiment, the first pad 222B is a first end portion of the second inductor wiring line 220B and the second pad 223B is a second end portion of the second inductor wiring line 220B.

The current flows between the first end portion on one side and the second end portion on the other side of the second inductor wiring line 220B in the extension direction of the second inductor wiring line 220B. In this embodiment, the current flows from the first pad 222B to the second pad 223B in the second inductor wiring line 220B. In other words, the current flows from the first end portion to the second end portion of the second inductor wiring line 220B. Therefore, the current flows from the first end portion to the second end portion, that is, in a common direction between the first end portion and the second end portion in the first inductor wiring line 220A and the second inductor wiring line 220B.

In the fifth layer L25, in a plan view, the second wiring line body 221B of the second inductor wiring line 220B extends in a substantially spiral shape around the center of the substantially spiral shape of the first inductor wiring line 220A. Specifically, the second wiring line body 221B of the second inductor wiring line 220B is wound in a substantially spiral shape in the anticlockwise direction from the first end thereof that is on the outside in a radial direction to the second end thereof that is on the inside in the radial direction. In other words, the second inductor wiring line 220B is wound in the opposite direction to the first inductor wiring line 220A.

In this embodiment, the angle through which the second inductor wiring line 220B is wound is 540°. Therefore, the number of turns through which the second inductor wiring line 220B is wound is 1.5 turns in this embodiment.

The first pad 222B is connected to the first end of the second wiring line body 221B, which is on one side in the direction in which the second wiring line body 221B extends. The first pad 222B has a substantially rectangular shape in a plan view. The first pad 222B forms the first end portion of the second inductor wiring line 220B. The first pad 222B is arranged near a corner of the fifth layer L25 which has a substantially rectangular shape in a plan view. In particular, in this embodiment, the first pad 222B is arranged above the first layer connection wiring line 261 in the first layer L21 and is connected to the first layer connection wiring line 261 by the second via 252. The wiring line width of the first pad 222B is larger than that of the second wiring line body 221B connected to the first pad 222B.

The second pad 223B is connected to the second end of the second wiring line body 221B, which is on the other side in the direction in which the second wiring line body 221B extends. The second pad 223B has a substantially circular shape when seen in a plan view in the up-down direction.

The second pad 223B is arranged above the second pad 223A in the first layer L21 and is connected to the second pad 223B by the third via 253. The wiring line width of the second pad 223B is larger than that of the second wiring line body 221B connected to the second pad 223B. The second pad 223B forms the second end portion of the second inductor wiring line 220B.

The dummy wiring line 230B is connected to the first pad 222B. The dummy wiring line 230B extends from the part of the first pad 222B on the opposite side from the second wiring line body 221B to the side surface of the fifth layer L25 and is exposed at the outer surface of the inductor component 210. The material of the dummy wiring line 230B is identical to that of the second inductor wiring line 220B. The second inductor wiring line 220B and the dummy wiring line 230B are integrated with each other.

In the fifth layer L25, the fifth layer connection wiring line 262 is arranged above the first pad 222A of the first layer L21. The fifth layer connection wiring line 262 has substantially the same shape as the first pad 222B and the dummy wiring line 230B and has line symmetry with the first pad 222B and the dummy wiring line 230B about an axis of symmetry that is a straight line passing through the center of the fifth layer L25 in the lateral direction and extending in the longitudinal direction of the fifth layer L25.

In the fifth layer L25, the side surfaces of the second inductor wiring line 220B, the side surfaces of the dummy wiring line 230B, and the side surfaces of the fifth layer connection wiring line 262 are covered by the fourth insulating portion 274. In other words, the second inductor wiring line 220B, the dummy wiring line 230B, and the fifth layer connection wiring line 262 are surrounded by the fourth insulating portion 274. The fourth insulating portion 274 is composed of an insulating resin having an insulating property, and the fourth insulating portion 274 has a higher insulating property than the second inductor wiring line 220B. The parts of the fifth layer L25 other than the second inductor wiring line 220B, the fifth layer connection wiring line 262, and the fourth insulating portion 274 consist of the fifth magnetic layer 245. Therefore, the fifth magnetic layer 245 is arranged in the center part of the fifth layer L25, in the two end parts of the fifth layer L25 in the lateral direction, and in the part of the fifth layer L25 on the first end side in the longitudinal direction.

The fifth magnetic layer 245 is composed of a mixture of a resin and a metal magnetic powder. Therefore, the fifth magnetic layer 245 is composed of a magnetic material. In addition, the fourth insulating portion 274 is composed of an insulating resin having an insulating property the same as the first insulating portion 271, and the fourth insulating portion 274 has a higher insulating property than the second inductor wiring line 220B.

As illustrated in FIG. 5, a sixth layer L26 having a substantially rectangular shape in a plan view, the same as the first layer L21, is stacked on the upper surface of the fifth layer L25. The sixth layer L26 consists of a fifth insulating portion 275, the fourth via 254, the fifth via 255, the sixth via 256, and a sixth magnetic layer 246. The fourth via 254, the fifth via 255, and the sixth via 256 penetrate through the sixth magnetic layer 246 in the stacking direction.

The fourth via 254 is arranged on the upper side of the first pad 222B of the fifth layer L25 and is connected to the first pad 222B. The fifth via 255 is arranged on the upper side of the fifth layer connection wiring line 262 of the fifth layer L25 and is connected to the fifth layer connection wiring line 262. The sixth via 256 is arranged on the upper side of the second pad 223B of the fifth layer L25 and is connected to the second pad 223B. The fourth via 254, the fifth via 255, and the sixth via 256 have substantially columnar shapes and the axial directions thereof are the same as the stacking direction. The dimensions of the fourth via 254, the fifth via 255, and the sixth via 256 in the stacking direction are identical to the dimension of the sixth layer L26 in the stacking direction. Therefore, the fourth via 254, the fifth via 255, and the sixth via 256 penetrate through the sixth layer L26 in the stacking direction.

The fifth insulating portion 275 covers the second inductor wiring line 220B, the dummy wiring line 230B, the fifth layer connection wiring line 262, and the fourth insulating portion 274 from above. In other words, the fifth insulating portion 275 entirely covers the upper surfaces of the wiring lines arranged in the fifth layer L25 except for the parts thereof where the fourth via 254, the fifth via 255, and the sixth via 256 are arranged. In a plan view, the fifth insulating portion 275 is shaped so as to cover a slightly wider area than the outer edges of the second inductor wiring line 220B, the dummy wiring line 230B, and the fifth layer connection wiring line 262. Therefore, the fifth insulating portion 275 has substantially the same shape as the third insulating portion 273. The fifth insulating portion 275 is composed of an insulating resin having an insulating property the same as the first insulating portion 271, and the fifth insulating portion 275 has a higher insulating property than the first inductor wiring line 220A.

In the inductor component 210, the first insulating portion 271, the second insulating portion 272, the third insulating portion 273, the fourth insulating portion 274, and the fifth insulating portion 275 are connected to each other, and together form an insulating portion 270. The insulating portion 270 surrounds and covers most of the outer surfaces of the first inductor wiring line 220A and the outer surfaces of the second inductor wiring line 220B. Note that the first insulating portion 271, the second insulating portion 272, the third insulating portion 273, the fourth insulating portion 274, and the fifth insulating portion 275 are illustrated as being separate from each other but are in fact integrated with each other in the form of the insulating portion 270. Furthermore, the material of the insulating portion 270 is a non-magnetic material that does not contain a magnetic powder.

The parts of the sixth layer L26 other than the fourth via 254, the fifth via 255, the sixth via 256, and the fifth insulating portion 275 consist of the sixth magnetic layer 246. The sixth magnetic layer 246 is composed of a mixture of a resin and a metal magnetic powder and is therefore composed of a magnetic material similarly to the first magnetic layer 241 described above. Therefore, the sixth magnetic layer 246 is arranged in the center part of the sixth layer L26, in the two end parts of the sixth layer L26 in the lateral direction, and in the part of the sixth layer L26 on the first end side in the longitudinal direction.

A seventh layer L27 having a substantially rectangular shape in a plan view, the same as the first layer L21, is stacked on the upper surface of the sixth layer L26. The seventh layer L27 consists of the first columnar wiring line 257, the second columnar wiring line 258, a third columnar wiring line 259, and a seventh magnetic layer 247. The first columnar wiring line 257, the second columnar wiring line 258, and the third columnar wiring line 259 penetrate through the seventh magnetic layer 247 in the stacking direction.

The first columnar wiring line 257 is arranged above the fifth layer connection wiring line 262 in the fifth layer L25 and is connected to the fifth layer connection wiring line 262 by the fifth via 255. The third columnar wiring line 259 is arranged above the first pad 222B in the fifth layer L25 and is connected to the first pad 222B by the fourth via 254. The first columnar wiring line 257 and the third columnar wiring line 259 have substantially prismatic shapes and the axial directions thereof are the same as the stacking direction. The dimensions of the first columnar wiring line 257 and the third columnar wiring line 259 in the stacking direction are identical to the dimension of the seventh layer L27 in the stacking direction. Therefore, the first columnar wiring line 257 and the third columnar wiring line 259 penetrate through the seventh layer L27 in the stacking direction.

The first columnar wiring line 257 is connected to the first pad 222A of the first inductor wiring line 220A by the fifth via 255, the fifth layer connection wiring line 262, and the first via 251. In this embodiment, a first vertical wiring line is formed by the first via 251, the fifth layer connection wiring line 262, the fifth via 255, and the first columnar wiring line 257.

In this case, the third columnar wiring line 259 is connected to the first pad 222B of the second inductor wiring line 220B by the fourth via 254. Furthermore, the first layer connection wiring line 261 is connected to the first pad 222B of the second inductor wiring line 220B by the second via 252. In this embodiment, a third vertical wiring line is formed by the first layer connection wiring line 261, the second via 252, the fourth via 254, and the third columnar wiring line 259.

The second columnar wiring line 258 is arranged above the second pad 223B of the second inductor wiring line 220B and is connected to the second pad 223B by the sixth via 256. The second columnar wiring line 258 has a substantially cylindrical shape and the axial direction of the cylindrical shape is the same as the stacking direction. The dimension of the second columnar wiring line 258 in the stacking direction is identical to the dimension of the seventh layer L27 in the stacking direction. Therefore, the second columnar wiring line 258 penetrates through the seventh layer L27 in the stacking direction.

In this case, the second columnar wiring line 258 is connected to the second pad 223B, which is the second end of the second inductor wiring line 220B, by the sixth via 256. Furthermore, the second pad 223B is connected to the second pad 223A, which is the second end of the first inductor wiring line 220A, by the third via 253. In this embodiment, a second vertical wiring line is formed by the third via 253, the sixth via 256, and the second columnar wiring line 258. Therefore, the third via 253 of the second vertical wiring line is connected to the second pad 223A of the first inductor wiring line 220A and the second pad 223B of the second inductor wiring line 220B, and the second columnar wiring line 258 of the second vertical wiring line is connected to the second pad 223A of the first inductor wiring line 220A.

The parts of the seventh layer L27 other than the first columnar wiring line 257 and the second columnar wiring line 258 consist of the seventh magnetic layer 247. Therefore, the seventh magnetic layer 247 is stacked on the upper surface of the second inductor wiring line 220B. The seventh magnetic layer 247 is composed of a mixture of a resin and a metal magnetic powder and is therefore composed of a magnetic material similarly to the first magnetic layer 241 described above.

In the inductor component 210, the first magnetic layer 241, the second magnetic layer 242, the third magnetic layer 243, the fourth magnetic layer 244, the fifth magnetic layer 245, the sixth magnetic layer 246, and the seventh magnetic layer 247 are connected to each other and together form a magnetic layer 240. The magnetic layer 240 surrounds the first inductor wiring line 220A and the second inductor wiring line 220B. Thus, the magnetic layer 240 forms a closed magnetic path with respect to the first inductor wiring line 220A and the second inductor wiring line 220B. Note that the first magnetic layer 241, the second magnetic layer 242, the third magnetic layer 243, the fourth magnetic layer 244, the fifth magnetic layer 245, the sixth magnetic layer 246, and the seventh magnetic layer 247 are illustrated as being separate from each other, but are in fact integrated with each other in the form of the magnetic layer 240.

The dimensions of the first columnar wiring line 257 and the second columnar wiring line 258 in the stacking direction are identical to the dimension of the seventh magnetic layer 247 in the stacking direction. Therefore, the upper surface of the first columnar wiring line 257 and the upper surface of the second columnar wiring line 258 are exposed from the seventh magnetic layer 247.

Next, the operations and effects of the above-described third embodiment will be described. In addition to the effects (1) and (3) of the first embodiment described above, the third embodiment also exhibits the following effects.

(7) According to the third embodiment, the first inductor wiring line 220A and the second inductor wiring line 220B are arranged so as to be arrayed in the stacking direction. The second pad 223A, which is the second end portion of the first inductor wiring line 220A, and the second pad 223B, which is the second end portion of the second inductor wiring line 220B, are connected to each other by the third via 253 of the second vertical wiring line. Therefore, an increase in the planar direction dimensions of the inductor component 210 on the whole can be suppressed while accommodating two inductor wiring lines 220.

(8) According to the third embodiment, the first inductor wiring line 220A and the second inductor wiring line 220B are covered by the insulating portion 270, which is composed of an insulating resin. Therefore, the first inductor wiring line 220A and the second inductor wiring line 220B are unlikely to be affected by static electricity from outside the inductor component 210. Furthermore, leakage of current and short circuits between the inductor wiring lines 220 are suppressed.

Fourth Embodiment

Hereafter, an inductor component according to a fourth embodiment will be described. The fourth embodiment described hereafter mainly differs from the inductor component 10 of the first embodiment with respect to the locations where a plurality of inductor wiring lines are connected to each other.

Figure 7:
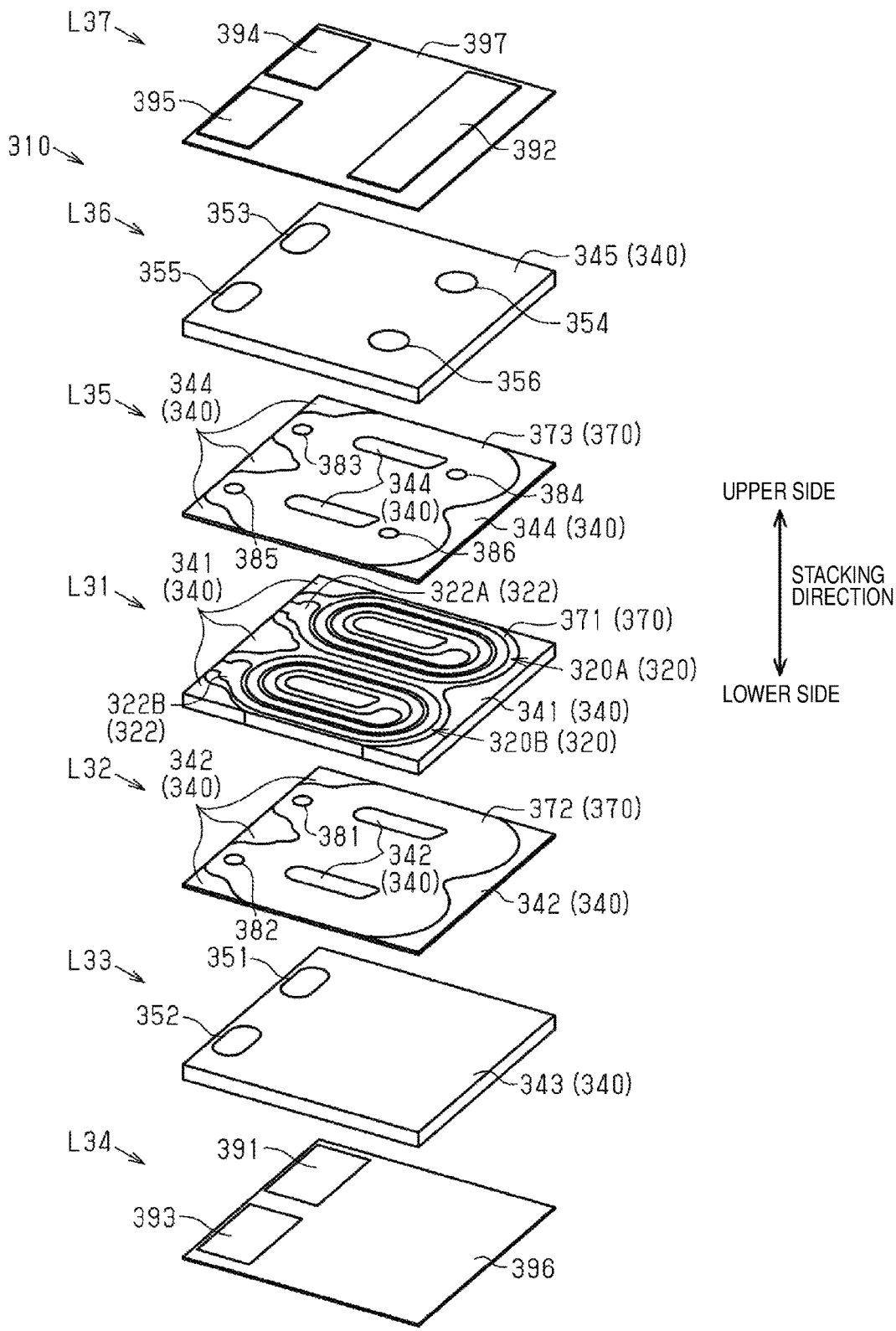
FIG. 7 is an exploded perspective view of an inductor component of a fourth embodiment.

As illustrated in FIG. 7, an inductor component 310 has an overall structure in which seven thin plate-like layers are stacked in a thickness direction. In the following description, a stacking direction in which the seven layers are stacked is referred to as an up-down direction. Note that the stacking direction is a direction that is vertical to the plane of the paper in FIG. 8.

Figure 8:
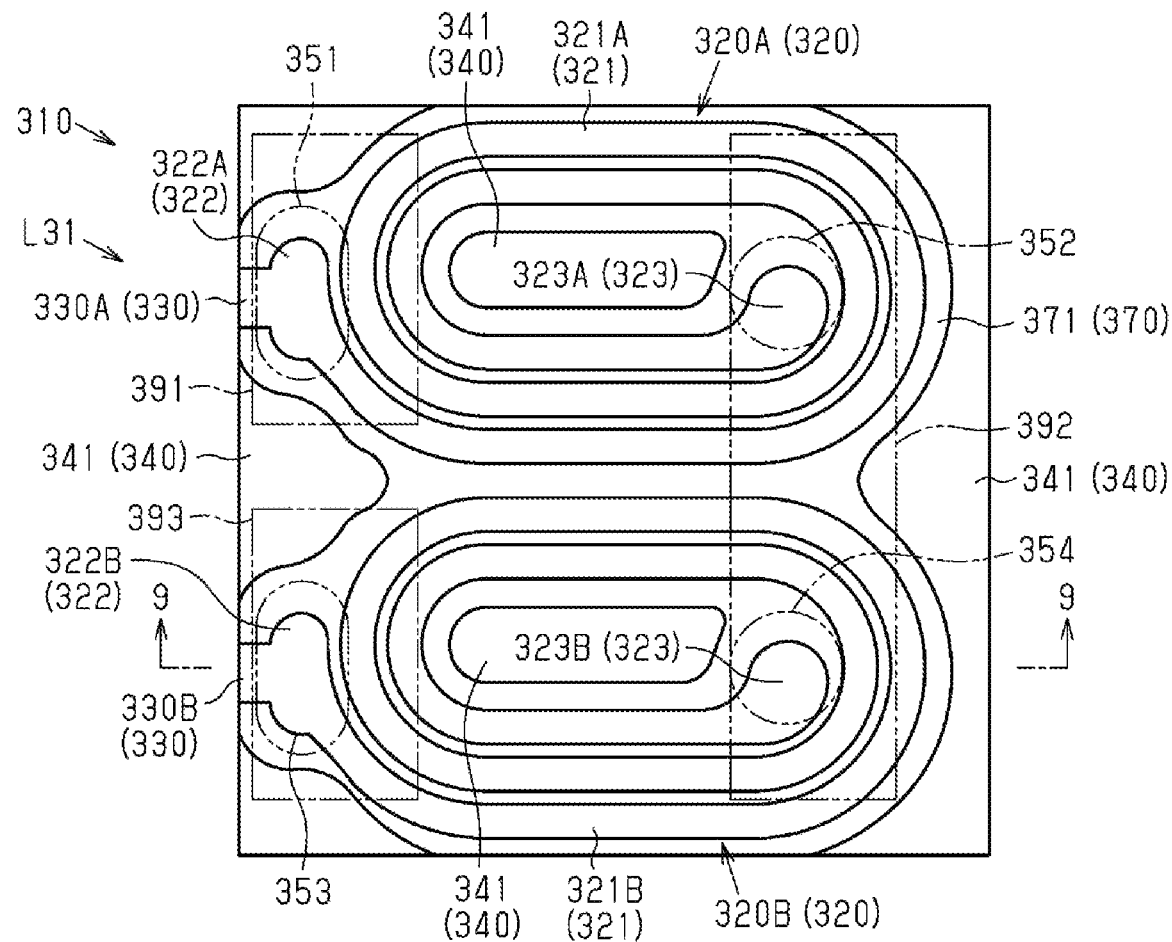
FIG. 8 is a see-through plan view of the inductor component of the fourth embodiment.

As illustrated in FIG. 8, a first layer L31 is formed of two inductor wiring lines 320, two dummy wiring lines 330, a first magnetic layer 341, and a first insulating portion 371. The first layer L31 has a substantially square shape when seen in a plan view. The two inductor wiring lines 320 include a first inductor wiring line 320A and a second inductor wiring line 320B. The inductor wiring lines 320 each include a wiring line body 321 having a substantially constant line width, a first pad 322 that is connected to a first end of the wiring line body 321, and a second pad 323 that is connected to a second end of the wiring line body 321. In this embodiment, the first pad 322 is a first end portion of the inductor wiring line 320 and the second pad 323 is a second end portion of the inductor wiring line 320.

In each inductor wiring line 320, a current flows from the first pad 322 to the second pad 323. In other words, in each inductor wiring line 320, the current flows in a common direction between the first end portion of the inductor wiring line 320 on one side and the second end portion of the inductor wiring line 320 on the other side in the extension direction of the inductor wiring line 320. In this embodiment, in both of the two inductor wiring lines 320, the current flows from the first end portion to the second end portion.

As illustrated in FIG. 8, the first inductor wiring line 320A and the second inductor wiring line 320B are arrayed in a first side direction, which is one of the directions of the sides of the first layer L31, which has a substantially square shape in a plan view. In a plan view, a first wiring line body 321A of the first inductor wiring line 320A extends in a substantially spiral shape around the vicinity of a point that is located in the middle between a first end of the first layer L31 in the first side direction and the center of the first layer L31 in the first side direction and that is located at the center of a second side direction that is perpendicular to the first side direction. Specifically, the first wiring line body 321A of the first inductor wiring line 320A is wound in a substantially spiral shape in the anticlockwise direction from the first end thereof that is on the outside in a radial direction to the second end thereof that is on the inside in the radial direction.

In this embodiment, the angle through which the first inductor wiring line 320A is wound is 900°. Therefore, the number of turns through which the first inductor wiring line 320A is wound is 2.5 turns in this embodiment.

The first inductor wiring line 320A is composed of an electrically conductive material, and in this embodiment, the composition of the first inductor wiring line 320A is such that the proportion of copper is 99 wt % or more and the proportion of sulfur is 0.1 wt % or more but less than 1.0 wt % (i.e., from 0.1 wt % to less than 1.0 wt %).

A first pad 322A is connected to the first end of the first wiring line body 321A, which is on one side in the extension direction of the first wiring line body 321A. The first pad 322A has a substantially elliptical shape in a plan view. The first pad 322A forms a first end portion of the first inductor wiring line 320A. The first pad 322A is arranged on one side in the second side direction of the first layer L31, which has a substantially square shape in a plan view.

A second pad 323A is connected to the second end of the first wiring line body 321A which is on the other side in the extension direction of the first wiring line body 321A. The second pad 323A has a substantially circular shape in a plan view. The second pad 323A forms the second end portion of the first inductor wiring line 320A.

A first dummy wiring line 330A extends from the first pad 322A to the side surface of the first layer L31 and is exposed at the outer surface of the inductor component 310. The material of the first dummy wiring line 330A is identical to that of the first inductor wiring line 320A.

The second inductor wiring line 320B is arranged on the opposite side from the first inductor wiring line 320A with respect to the center of the first layer L31, which has a substantially square shape, in the first side direction. In a plan view, a second wiring line body 321B of the second inductor wiring line 320B extends in a substantially spiral shape around the vicinity of a point that is located in the middle between a second end of the first layer L31 in the first side direction and the center of the first layer L31 in the first side direction and that is located at the center of the second side direction that is perpendicular to the first side direction. Specifically, the second wiring line body 321B of the second inductor wiring line 320B is wound in a substantially spiral shape in the anticlockwise direction from the first end thereof that is on the outside in a radial direction to the second end thereof that is on the inside in the radial direction.

The shape, dimensions, and material of the second wiring line body 321B are the same as those of the first wiring line body 321A. Therefore, the angle through which the second inductor wiring line 320B is wound is 900° and the number of turns through which the second inductor wiring line 320B is wound is 2.5 turns. In addition, the second inductor wiring line 320B is composed of an electrically conductive material, and the composition of the second inductor wiring line 320B is such that the proportion of copper is 99 wt % or more and the proportion of sulfur is 0.1 wt % or more but less than 1.0 wt % (i.e., from 0.1 wt % to less than 1.0 wt %).

A first pad 322B is connected to a first end of the second wiring line body 321B, which is on one side in the extension direction of the second wiring line body 321B. The first pad 322B has a substantially elliptical shape in a plan view. The first pad 322B forms a first end portion of the second inductor wiring line 320B. The first pad 322B is arranged on one side in the second side direction of the first layer L31, which has a substantially square shape in a plan view.

A second pad 323B is connected to the second end of the second wiring line body 321B which is on the other side in the extension direction of the second wiring line body 321B. The second pad 323B has a substantially circular shape in a plan view. The second pad 323B forms the second end portion of the second inductor wiring line 320B.

A second dummy wiring line 330B extends from the first pad 322B to the side surface of the first layer L31 and is exposed at the outer surface of the inductor component 310. The material of the second dummy wiring line 330B is identical to that of the second inductor wiring line 320B.

In the first layer L31, the side surfaces of the inductor wiring lines 320 and the side surfaces of the dummy wiring lines 330 are covered by the first insulating portion 371. In other words, the inductor wiring lines 320 and the dummy wiring lines 330 are surrounded by the first insulating portion 371. The first insulating portion 371 is composed of an insulating resin having an insulating property, and the first insulating portion 371 has a higher insulating property than the inductor wiring lines 320. The parts of the first layer L31 other than the inductor wiring lines 320, the dummy wiring lines 330, and the first insulating portion 371 consist of the first magnetic layer 341. Therefore, the first magnetic layer 341 is arranged in the vicinity of the center of rotation of the wiring line body 321 of each inductor wiring line 320 and in the center and at both end parts of the first layer L31, which has a substantially square shape in a plan view, in the second side direction.

The first magnetic layer 341 is composed of a mixture of a resin and a metal magnetic powder. Therefore, the first magnetic layer 341 is composed of a magnetic material. In FIG. 8, a first columnar wiring line 351, a second columnar wiring line 352, a third columnar wiring line 353, and a fourth columnar wiring line 354, a first outer terminal 391, a second outer terminal 392, and a third outer terminal 393, which will be described later, are illustrated by double-dot chain lines.

As illustrated in FIG. 7, a second layer L32 having a substantially rectangular shape in a plan view, the same as the first layer L31, is stacked on the lower surface of the first layer L31. The second layer L32 consists of a first via 381, a second via 382, a second insulating portion 372, and a second magnetic layer 342.

The first via 381 is arranged on the lower side of the first pad 322A of the first inductor wiring line 320A and is connected to the first pad 322A. The second via 382 is arranged on the lower side of the first pad 322B of the second inductor wiring line 320B and is connected to the first pad 322B. The first via 381 and second via 382 each have a substantially cylindrical shape and the axial directions thereof are the same as the stacking direction. The dimensions of the first via 381 and the second via 382 in the stacking direction are identical to the dimension of the second layer L32 in the stacking direction. Therefore, the first via 381 and the second via 382 penetrate through the second layer L32 in the stacking direction.

The second insulating portion 372 covers the inductor wiring lines 320, the dummy wiring lines 330, and the first insulating portion 371 from below. In other words, the second insulating portion 372 entirely covers the lower surfaces of the wiring lines except for the parts where the first via 381 and the second via 382 are arranged. In a plan view, the second insulating portion 372 is shaped so as to cover a slightly wider area than the outer edge of the first insulating portion 371. The second insulating portion 372 is composed of an insulating resin having an insulating property the same as the first insulating portion 371, and the second insulating portion 372 has a higher insulating property than the inductor wiring lines 320.

The parts of the second layer L32 other than the first via 381, the second via 382, and the third insulating portion 372 consist of the second magnetic layer 342. Therefore, in a plan view of the second layer L32, the second magnetic layer 342 is arranged in the vicinity of the center of rotation of the wiring line body 321 of each inductor wiring line 320 and in the center and at both end parts of the second layer L32, which has a substantially square shape in a plan view, in the second side direction. The second magnetic layer 342 is composed of a mixture of a resin and a metal magnetic powder and is therefore composed of a magnetic material similarly to the first magnetic layer 341 described above.

A third layer L33 having a substantially rectangular shape in a plan view, the same as the first layer L31, is stacked on the lower surface of the second layer L32. The third layer L33 consists of the first columnar wiring line 351, the second columnar wiring line 352, and a third magnetic layer 343.

The first columnar wiring line 351 is arranged on the lower side of the first via 381 and is connected to the first via 381. The second columnar wiring line 352 is arranged on the lower side of the second via 382 and is connected to the second via 382. The first columnar wiring line 351 and the second columnar wiring line 352 have substantially columnar shapes and the axial directions thereof are the same as the stacking direction. The dimensions of the first columnar wiring line 351 and the second columnar wiring line 352 in the stacking direction are identical to the dimension of the third layer L33 in the stacking direction. Therefore, the first columnar wiring line 351 and the second columnar wiring line 352 penetrate through the third layer L33 in the stacking direction.

The parts of the third layer L33 other than the first columnar wiring line 351 and the second columnar wiring line 352 consist of the third magnetic layer 343. Therefore, the third magnetic layer 343 is stacked on the lower surfaces of the inductor wiring lines 320. The third magnetic layer 343 is composed of a mixture of a resin and a metal magnetic powder and is therefore composed of a magnetic material similarly to the first magnetic layer 341 described above.

In the third layer L33, the dimension of the third magnetic layer 343 in the stacking direction is identical to the dimensions of the first columnar wiring line 351 and the second columnar wiring line 352 in the stacking direction. Therefore, the lower surfaces of the first columnar wiring line 351 and the second columnar wiring line 352 are exposed from the third magnetic layer 343.

A fourth layer L34 having a substantially rectangular shape in a plan view, the same as the first layer L31, is stacked on the lower surface of the third layer L33. The fourth layer L34 consists of the first outer terminal 391, the third outer terminal 393, and a coating layer 396.

The first outer terminal 391 is arranged below the first columnar wiring line 351 and is connected to the first pad 322A of the first inductor wiring line 320A by the first columnar wiring line 351 and the first via 381. The third outer terminal 393 is arranged below the second columnar wiring line 352 and is connected to the first pad 322B of the second inductor wiring line 320B by the second columnar wiring line 352 and the second via 382. The first outer terminal 391 and the third outer terminal 393 are composed of electrically conductive materials, and in this embodiment have a three-layer structure consisting of copper, nickel, and gold. The first outer terminal 391 and the third outer terminal 393 have a substantially rectangular in a plan view and cover a slightly wider area than the first columnar wiring line 351.

The parts of the fourth layer L34 other than the first outer terminal 391 and the third outer terminal 393 consist of the coating layer 396. The coating layer 396 has a higher insulating property than the third magnetic layer 343, and in this embodiment, the coating layer 396 is composed of a solder resist. The dimensions of the first outer terminal 391 and the third outer terminal 393 of the fourth layer L34 in the stacking direction are larger than the dimension of the coating layer 396 in the stacking direction.

A fifth layer L35 having a substantially rectangular shape in a plan view, the same as the first layer L31, is stacked on the upper surface of the first layer L31. The fifth layer L35 consists of a third via 383, a fourth via 384, a fifth via 385, a sixth via 386, a third insulating portion 373, and a fourth magnetic layer 344.

The third via 383 is arranged on the upper side of the first pad 322A of the first inductor wiring line 320A and is connected to the first pad 322A. The fourth via 384 is arranged on the upper side of the second pad 323A of the first inductor wiring line 320A and is connected to the second pad 323A. The fifth via 385 is arranged on the upper side of the first pad 322B of the second inductor wiring line 320B and is connected to the first pad 322B. The sixth via 386 is arranged on the upper side of the second pad 323B of the second inductor wiring line 320B and is connected to the second pad 323B. The third via 383, the fourth via 384, the fifth via 385, and the sixth via 386 have substantially cylindrical shapes and the axial directions thereof are the same as the stacking direction. The dimensions of the third via 383, the fourth via 384, the fifth via 385, and the sixth via 386 in the stacking direction are identical to the dimension of the fifth layer L35 in the stacking direction. Therefore, the third via 383, the fourth via 384, the fifth via 385, and the sixth via 386 penetrate through the fifth layer L35 in the stacking direction.

The third insulating portion 373 covers the inductor wiring lines 320, the dummy wiring lines 330, and the first insulating portion 371 from above. In other words, the third insulating portion 373 entirely covers the upper surfaces of the wiring lines arranged in the first layer L31 except for the parts thereof where the third via 383, the fourth via 384, the fifth via 385, and the sixth via 386 are arranged. In a plan view, the third insulating portion 373 is shaped so as to cover a slightly wider area than the outer edge of the first insulating portion 371. Therefore, the shape of the third insulating portion 373 is similar to the shape of the second insulating portion 372 except for the places where the third via 383, the fourth via 384, the fifth via 385, and the sixth via 386 are arranged. The third insulating portion 373 is composed of an insulating resin having an insulating property the same as the first insulating portion 371, and the third insulating portion 373 has a higher insulating property than the inductor wiring lines 320.

In the inductor component 310, the first insulating portion 371, the second insulating portion 372, and the third insulating portion 373 are connected to each other and together form an insulating portion 370. The insulating portion 370 surrounds and covers most of the outer surfaces of the inductor wiring lines 320. Note that the first insulating portion 371, the second insulating portion 372, and the third insulating portion 373 are illustrated as being separate from each other but are in fact integrated with each other in the form of the insulating portion 370. Furthermore, the material of the insulating portion 370 is a non-magnetic material that does not contain a magnetic powder.

The parts of the fifth layer L35 other than the third via 383, the fourth via 384, the fifth via 385, the sixth via 386, and the third insulating portion 373 consist of the fourth magnetic layer 344. The shape of the fourth magnetic layer 344 is identical to that of the second magnetic layer 342. The fourth magnetic layer 344 is composed of a mixture of a resin and a metal magnetic powder and is therefore composed of a magnetic material similarly to the first magnetic layer 341 described above.

A sixth layer L36 having a substantially rectangular shape in a plan view, the same as the first layer L31, is stacked on the upper surface of the fifth layer L35. The sixth layer L36 consists of the third columnar wiring line 353, the fourth columnar wiring line 354, a fifth columnar wiring line 355, a sixth columnar wiring line 356, and a fifth magnetic layer 345.

The third columnar wiring line 353 is arranged above the first pad 322A of the first inductor wiring line 320A and is connected to the first pad 322A by the third via 383. The fourth columnar wiring line 354 is arranged above the second pad 323A of the first inductor wiring line 320A and is connected to the second pad 323A by the fourth via 384. The fifth columnar wiring line 355 is arranged above the first pad 322B of the second inductor wiring line 320B and is connected to the first pad 322B by the fourth via 384. The sixth columnar wiring line 356 is arranged above the second pad 323B of the second inductor wiring line 320B and is connected to the second pad 323B by the sixth via 386. The third columnar wiring line 353, the fourth columnar wiring line 354, the fifth columnar wiring line 355, and the sixth columnar wiring line 356 have substantially cylindrical shapes and the axial directions of the cylindrical shapes are the same as the stacking direction. Therefore, the third columnar wiring line 353, the fourth columnar wiring line 354, the fifth columnar wiring line 355, and the sixth columnar wiring line 356 penetrate through the sixth layer L36.

The parts of the sixth layer L36 other than the third columnar wiring line 353, the fourth columnar wiring line 354, the fifth columnar wiring line 355, and the sixth columnar wiring line 356 consist of the fifth magnetic layer 345. Therefore, the fifth magnetic layer 345 is stacked on the upper surfaces of the inductor wiring lines 320. The fifth magnetic layer 345 is composed of a mixture of a resin and a metal magnetic powder and is therefore composed of a magnetic material similarly to the first magnetic layer 341 described above.

In the inductor component 310, the first magnetic layer 341, the second magnetic layer 342, the third magnetic layer 343, the fourth magnetic layer 344, and the fifth magnetic layer 345 are connected to each other and together form a magnetic layer 340. The magnetic layer 340 surrounds the inductor wiring lines 320. Thus, the magnetic layer 340 forms a closed magnetic path with respect to the inductor wiring lines 320. Note that the first magnetic layer 341, the second magnetic layer 342, the third magnetic layer 343, the fourth magnetic layer 344, and the fifth magnetic layer 345 are illustrated as being separate from each other but are in fact integrated with each other in the form of the magnetic layer 340.

The dimension of the fifth magnetic layer 345 in the stacking direction is identical to the dimension of the sixth layer L36 in the stacking direction. Therefore, the upper surfaces of the third columnar wiring line 353, the fourth columnar wiring line 354, the fifth columnar wiring line 355, and the sixth columnar wiring line 356 are exposed from the fifth magnetic layer 345.

A seventh layer L37 having a substantially rectangular shape in a plan view, the same as the first layer L31, is stacked on the upper surface of the sixth layer L36. The seventh layer L37 consists of the second outer terminal 392, a fourth outer terminal 394, a fifth outer terminal 395, and a coating layer 397.

The fourth outer terminal 394 is arranged above of the first columnar wiring line 351 and is connected to the first pad 322A of the first inductor wiring line 320A by the first columnar wiring line 351 and the third via 383. The fifth outer terminal 395 is arranged above the second columnar wiring line 352 and is connected to the first pad 322B of the second inductor wiring line 320B by the second columnar wiring line 352 and the fifth via 385. The fourth outer terminal 394 and the fifth outer terminal 395 are composed of electrically conductive materials, and in this embodiment have a three-layer structure consisting of copper, nickel, and gold. The fourth outer terminal 394 has a substantially rectangular shape in a plan view and covers a wider area than the third columnar wiring line 353. The fifth outer terminal 395 has a substantially rectangular shape in a plan view and covers a wider area than the fifth columnar wiring line 355. In this embodiment, the fourth outer terminal 394 functions as a second first outer terminal and the fifth outer terminal 395 functions as a second third outer terminal.

The second outer terminal 392 is arranged on the upper side of the fourth columnar wiring line 354 and the sixth columnar wiring line 356 so as to straddle the fourth columnar wiring line 354 and the sixth columnar wiring line 356 and are connected to the fourth columnar wiring line 354 and the sixth columnar wiring line 356. In addition, the second outer terminal 392 is connected to the second pad 323A of the first inductor wiring line 320A and the second pad 323B of the second inductor wiring line 320B by the fourth columnar wiring line 354 and the sixth columnar wiring line 356. The second outer terminal 392 is composed of electrically conductive materials, and in this embodiment has a three-layer structure consisting of copper, nickel, and gold. In a plan view, the second outer terminal 392 has a substantially rectangular shape that is elongated in the direction in which the two inductor wiring lines 320 are arrayed. In a plan view, the second outer terminal 392 is of such a size as to cover the fourth columnar wiring line 354 and the sixth columnar wiring line 356.

The parts of the seventh layer L37 other than the second outer terminal 392, the fourth outer terminal 394, and the fifth outer terminal 395 consist of the coating layer 397. The coating layer 397 has a higher insulating property than the fifth magnetic layer 345, and in this embodiment, the coating layer 397 is composed of a solder resist. The dimensions of the second outer terminal 392, the fourth outer terminal 394, and the fifth outer terminal 395 in the stacking direction are larger than the dimension of the coating layer 397 in the stacking direction.

Figure 9:
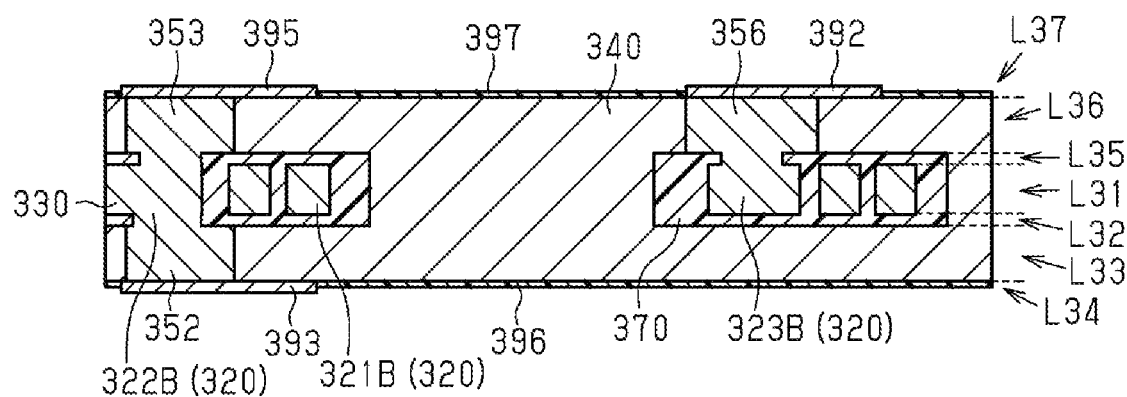
FIG. 9 is a sectional view of the inductor component of the fourth embodiment.

As illustrated in FIG. 9, the thickness of the first layer L31, the thickness of the third layer L33, and the thickness of the sixth layer L36 are substantially identical. In addition, the thickness of the second layer L32 and the thickness of the fifth layer L35 are substantially identical and these thicknesses are smaller than the thickness of the first layer L31. In addition, the thickness of the fourth layer L34 and the thickness of the coating layer 397 of the seventh layer L37 are substantially identical and are substantially identical to the thickness of the second layer L32.

Next, the operations and effects of the above-described fourth embodiment will be described. In addition to the effects (2) and (3) of the first embodiment described above, the fourth embodiment also exhibits the following effect.

(9) According to the fourth embodiment described above, one second outer terminal 392 is connected to the fourth columnar wiring line 354, which is connected to the second pad 323A of the first inductor wiring line 320A, and to the sixth columnar wiring line 356, which is connected to the second pad 323B of the second inductor wiring line 320B. Therefore, the number of second outer terminals 392 can be reduced compared with the case where individual second outer terminals 392 are connected to the fourth columnar wiring line 354 and the sixth columnar wiring line 356. Therefore, when designing the inductor component 310, it is possible to reduce the number of second outer terminals 392, and consequently the freedom of design is increased and an increase in the overall size of the inductor component 310 can be suppressed.

Inductor Component Mounted Substrate According to Embodiment

Hereafter, an inductor component mounted substrate according an embodiment will be described. Hereafter, an inductor component mounted substrate in which the inductor component 10 described in the first embodiment is mounted will be described. Note that in this embodiment, the same symbols as in the first embodiment are used to denote constituent parts that are the same as in the first embodiment and therefore description of those constituent parts is omitted.

Figure 10:
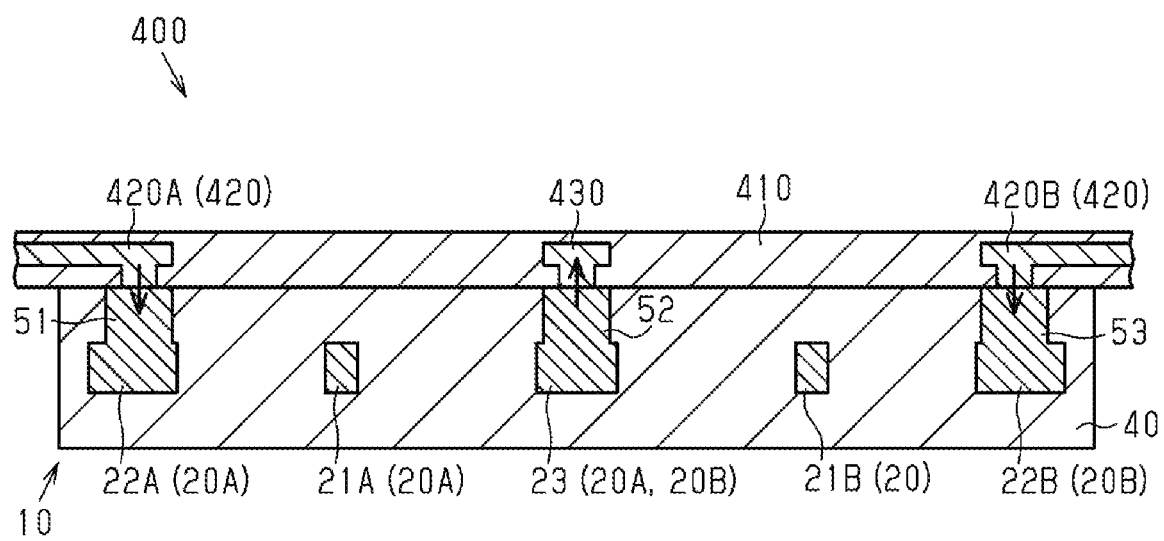
FIG. 10 is a sectional view of an inductor component mounted substrate of an embodiment.

As illustrated in FIG. 10, an inductor component mounted substrate 400 is formed by the inductor component 10 and a substrate 410 on which the inductor component 10 is mounted. The substrate 410 is substantially shaped like a plate and is larger than the inductor component 10 in planar directions.

The inductor component 10 is surface mounted on a first surface of the substrate 410 which is on one side in the thickness direction of the substrate 410. Four input wiring lines 420 are arranged inside the substrate 410. Although not illustrated, a first end of each input wiring line 420 in the extension direction of the input wiring lines 420 is connected to a high potential side terminal of a DC power supply. Therefore, the first columnar wiring line 51, which functions as the first vertical wiring line of the inductor component 10, the third columnar wiring line 53, which functions as the third vertical wiring line of the inductor component 10, and the fourth columnar wiring lines 54, which function as the fourth vertical wiring lines of the inductor component 10, function as the input side to which an input voltage is applied.

Second ends of the input wiring lines 420 in the extension direction of the input wiring lines 420 are exposed at the first surface of the substrate 410. The places where the second ends of the input wiring lines 420 are exposed are arranged so that the first columnar wiring line 51, the third columnar wiring line, and the fourth columnar wiring lines 54 are connected thereto when the inductor component 10 is mounted on the substrate 410. Specifically, among the four input wiring lines 420, a first input wiring line 420A is connected to the first columnar wiring line 51 and a second input wiring line 420B is connected to the third columnar wiring line 53. In addition, although not illustrated, two third input wiring lines are connected to the fourth columnar wiring lines 54. Therefore, the number of input wiring lines 420 is equal to the number of first vertical wiring lines of the inductor wiring lines 20.

In addition, one output wiring line 430 is arranged inside the substrate 410. A first end of the output wiring line 430 in the extension direction of the output wiring line 430 is exposed at the first surface of the substrate 410. The place where the first end of the output wiring line 430 is exposed is arranged so that the output wiring line 430 is connected to the second columnar wiring line 52 of the inductor component 10 when the inductor component 10 is mounted on the substrate 410. Therefore, an output voltage that is lower than the input voltage is applied to the second columnar wiring line 52 of the inductor component 10 and the second columnar wiring line 52 functions as an output side.

Next, the operations and effects of the inductor component mounted substrate of this embodiment will be described. In addition to the effects (1) to (4) of the first embodiment described above, the following effect is also exhibited.

(10) According to the inductor component mounted substrate of this embodiment, once the inductor component 10, which includes the plurality of inductor wiring lines 20, has been mounted, the first end portions of the inductor wiring lines 20 can be used as an input side and the second end portions of the inductor wiring lines 20 can be used as an output side.

The above-described embodiments can be modified in the following ways.

The embodiments and the following modifications can be combined with each other to the extent that there are no technical inconsistencies.

In the above-described embodiments, it is sufficient that an "inductor wiring line" be an element that can give an inductance to an inductor component by generating magnetic flux in a magnetic layer when a current flows therealong.

Figure 11:
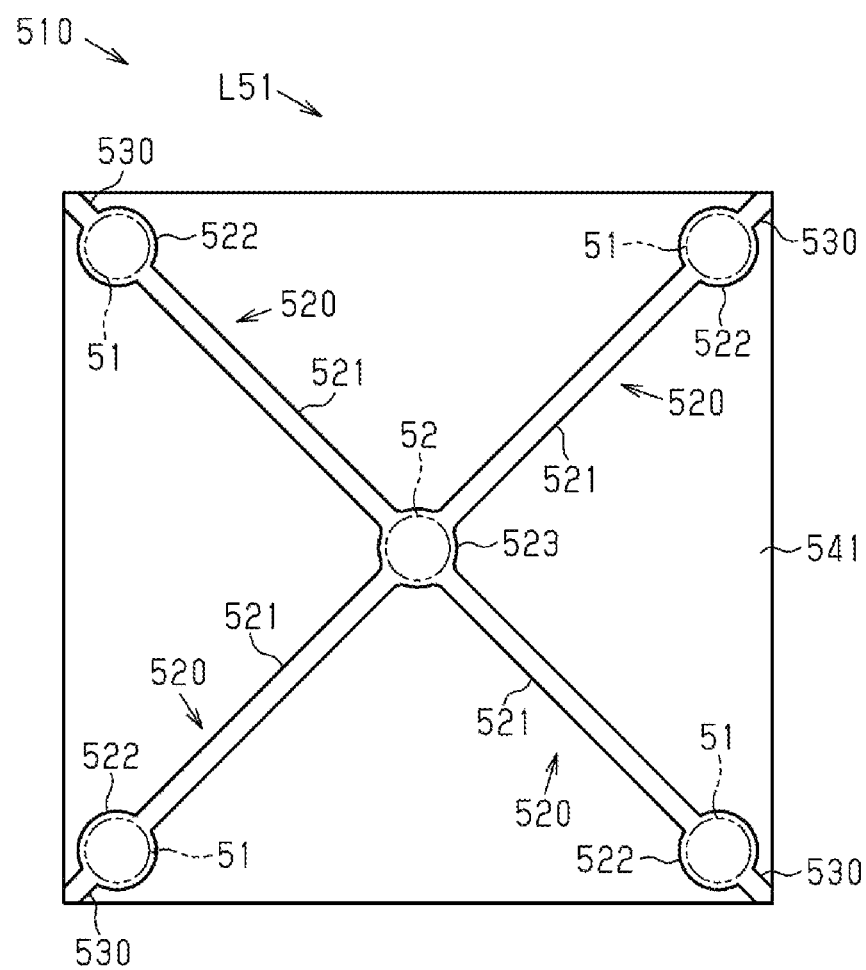
FIG. 11 is a see-through plan view of an inductor component of a modification.

In the above-described embodiments, the shapes of the inductor wiring lines are not limited to the examples given in the embodiments. Therefore, in the first embodiment and the second embodiment, the inductor wiring lines may have a curved line shape of 1.0 or more turns or may have a straight line shape of 0 turns. In addition, in the third embodiment and the fourth embodiment, the inductor wiring lines may have a curved line shape of less than 1.0 turns or may have a straight line shape of 0 turns. More specifically, as illustrated in FIG. 11, an inductor component 510 may be provided that includes substantially straight-line-shaped inductor wiring lines 520. In this case, in a first layer L51, wiring line bodies 521 of the inductor wiring lines 520 have substantially straight line shapes, first pads 522 are connected to first ends of the wiring line bodies 521 in the extension directions of the wiring line bodies 521, and a second pad 523 is connected to second ends of the wiring line bodies 521 in the extension directions of the wiring line bodies 521. Note that the parts of the first layer L51 other than the inductor wiring lines 520 and dummy wiring lines 530 are constituted by a magnetic layer 541. Furthermore, as illustrated in FIG. 11, the entirety of each of the four inductor wiring lines 520 may extend radially from the second pad 23 and the wiring line bodies 21 of the inductor wiring lines 20 in the first embodiment may all have a substantially curved shape. In addition, any of the plurality of inductor wiring lines may have a different shape from the rest of the inductor wiring lines. Furthermore, in each embodiment, the inductor wiring lines may have a meandering shape.

In the above-described embodiments, the structures of the inductor wiring lines are not limited to the examples given in the embodiments. For example, the first pad and the second pad of an inductor wiring line may be omitted, and the shapes of the first pad and the second pad are not limited to the examples given in the embodiments. It is sufficient that at least a first vertical wiring line be connected to a first end portion of an inductor wiring line and a second vertical wiring line be connected to a second end portion of the inductor wiring line.

In the first embodiment, the second end portions of the third inductor wiring lines 20C do not necessarily have to be formed by the second pad 23, and the second end portion of at least one third inductor wiring line 20C among the plurality of third inductor wiring lines 20C may be formed by the second pad 23.

In the first embodiment and the second embodiment, the second end portions of all the third inductor wiring lines among the third inductor wiring lines do not have to be connected to the second vertical wiring line. For example, one third inductor wiring line among two third inductor wiring lines may be connected to the second columnar wiring line and the other third inductor wiring line among the two third inductor wiring lines may be connected to a fifth vertical wiring line that is different from the second vertical wiring line. In addition, it is sufficient that the fifth vertical wiring line penetrate through the magnetic layer and be exposed at the outer surface of the magnetic layer. Furthermore, among four inductor wiring lines, the second end portions of two inductor wiring lines may be formed by one second pad and the second end portions of the other two inductor wiring lines may be formed by another one second pad. In the case where there are three or more inductor wiring lines, it is sufficient that a shared second vertical wiring line be connected to the second end portions of at least two inductor wiring lines, and for example, a shared second vertical wiring line may be connected to the second end portions of three inductor wiring lines in the case where there are four inductor wiring lines.

In the above-described embodiments, the shapes of the first pads and the second pad are not limited to the examples given in the embodiments. For example, the shapes of the first pads and the second pad may be a substantially elliptical shape or a substantially polygonal shape when seen in a plan view.

In the above-described embodiments, the composition of the inductor wiring lines is not limited to the examples given in the embodiments.

In the above-described embodiments, the composition of the magnetic layers is not limited to the examples given in the embodiments. For example, the material of the magnetic layers may be a ferrite powder or may be a mixture of a ferrite powder and a metal magnetic powder.

In the above-described embodiments, the magnetic layers do not have to be integrated with each other. For example, in the first embodiment, the first magnetic layer 41, the second magnetic layer 42, and the third magnetic layer 43 may be separately provided.

In the above-described embodiments, the number of inductor wiring lines is not limited to the examples given in the embodiments. It is sufficient that the number of inductor wiring lines be at least two.

In the above-described embodiments, the relationship between the lengths of the inductor wiring lines is not limited to the examples given in the embodiments. For example, in the first embodiment, the lengths of the wiring line bodies 21 of all the inductor wiring lines 20 may be different from each other.

In the above-described embodiments, the arrangement of the dummy wiring lines is not limited to the examples given in the embodiments. For example, as illustrated in FIG. 11, the dummy wiring lines 530 may extend toward the corners of the first layer L51. In addition, the dummy wiring lines may be omitted in the above-described embodiments.

In the above-described embodiments, the shape of each layer is not limited to the examples given in the embodiments. For example, a substantially polygonal, circular, or elliptical shape in a plan view may be adopted or a shape that is a combination of such shapes may be adopted.

In the first embodiment, the angular pitch $\theta$ is not limited to the example given in the first embodiment. In the case where the number of inductor wiring lines 20 is four, it is easy to design a structure in which the lengths of the inductor wiring lines 20 are identical to each other when the angular pitch $\theta$ is larger than 45° and smaller than 180°.

In the second embodiment, the first inter pad distance ID is not limited to the example given in the second embodiment. Specifically, when the first inter pad distance ID is 20 times or more, it can be said that the first inter pad distance ID between the first pads 122 is sufficiently large with respect to the size of the particle diameter of the metal magnetic powder. Therefore, it is easy to prevent a short circuit between two first pads 122. Furthermore, the first inter pad distance ID may be appropriately adjusted in accordance with variations in the size of the particle diameter of the metal magnetic powder and so on.

The insulating portions may be omitted in the third embodiment and the fourth embodiment. On the other hand, the insulating portions may be provided in the first embodiment and the second embodiment. Furthermore, part of an insulating portion may be omitted. For example, in the third embodiment, only the second insulating portion 272 out of the insulating portion 270 may be provided.

In the first embodiment, the second embodiment, and the third embodiment, outer terminals and coating layers may be provided.

In the fourth embodiment, the structures of the first outer terminal 391, the second outer terminal 392, the third outer terminal 393, the fourth outer terminal 394, and the fifth outer terminal 395 are not limited to the examples given in the fourth embodiment. For example, these terminals may be each formed of a copper-only layer.

In the fourth embodiment, either one of the first outer terminal 391 and the fourth outer terminal 394 may be omitted. Similarly, either one of the third outer terminal 393 and the fifth outer terminal 395 may be omitted. It is sufficient that there be one outer terminal that functions as a first outer terminal and one outer terminal that functions as a third outer terminal.

In the above-described embodiments, the number of first vertical wiring lines is not limited to the examples given in the embodiments. For example, in the first embodiment, first vertical wiring lines may penetrate through the second layer L2 and be connected to the lower surfaces of the first pads 22 of the inductor wiring lines 20.

In the above-described embodiments, the shape of first vertical wiring lines is not limited to the examples given in the embodiments. For example, the shape may be polygonal columnar shape or may be a shape that is a combination of a cylinder and a polygonal column.

In the above-described embodiments, each vertical wiring line includes a wiring line that penetrates through an insulating layer and a wiring line that penetrates through a magnetic layer. Therefore, a vertical wiring line may, for example, consist of only a columnar wiring line that penetrates through a magnetic layer from an end of an inductor wiring line to the outer surface of the magnetic layer, or a columnar wiring line that penetrates through a magnetic layer up to the outer surface of the magnetic layer may be connected to an end of an inductor wiring line by a via that penetrates through an insulating layer. Furthermore, components forming a vertical wiring line do not necessarily have to be integrated with each other and a vertical wiring line and an inductor wiring line do not necessarily have to be integrated with each other.

In the inductor component mounted substrate of the embodiment described above, the mounted inductor component is not limited to the inductor component 10 of the first embodiment. For example, the inductor component 310 of the fourth embodiment may be mounted.

In the inductor component mounted substrate of the embodiment described above, input wiring lines may be connected to outer terminals. For example, in the case where the inductor component 310 of the fourth embodiment is mounted, the first input wiring line 420A may be connected to the first outer terminal 391 or the fourth outer terminal 394 functioning as a first outer terminal and the second input wiring line 420B may be connected to the third outer terminal 393 or the fifth outer terminal 395 functioning as a third outer terminal.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor component comprising:
   first and second inductor wiring lines that are arranged inside a magnetic layer and along which a current flows in a common direction between first end portions of the first and second inductor wiring lines that are on one side and second end portions of the first and second inductor wiring lines that are on another side in extension directions of the inductor wiring lines, and the second end portions of the first and second inductor wiring lines are the same;
   a first vertical wiring line that is connected to the first end portion of the first inductor wiring line, penetrates through the magnetic layer, and is exposed at an outer surface of the magnetic layer;
   a second vertical wiring line that is connected to the second end portion of the first inductor wiring line, is connected to the second end portion of the second inductor wiring line, penetrates through the magnetic layer, and is exposed at the outer surface of the magnetic layer; and
   a third vertical wiring line that is connected to the first end portion of the second inductor wiring line, penetrates through the magnetic layer, and is exposed at the outer surface of the magnetic layer.

2. The inductor component according to claim 1, wherein the first inductor wiring line and the second inductor wiring line are arranged inside the same layer.

3. The inductor component according to claim 1, further comprising:
   a third inductor wiring line that is arranged inside the magnetic layer and along which a current flows in the common direction as in the first and second inductor wiring lines between a first end portion of the third inductor wiring line that is on one side and a second end portion of the third inductor wiring line that is on the other side in the extension direction of the third inductor wiring line; and
   a fourth vertical wiring line that is connected to the first end portion of the third inductor wiring line, that penetrates through the magnetic layer, and is exposed at the outer surface of the magnetic layer;
   wherein the second vertical wiring line is connected to the second end portion of the third inductor wiring line.

4. The inductor component according to claim 3, wherein the first inductor wiring line, the second inductor wiring line, and the third inductor wiring line each include a wiring line body, a first pad that is connected to the wiring line body and is configured as the first end portion of the inductor wiring line, and a second pad that is connected to the wiring line body and is configured as the second end portion of the inductor wiring line,
   the first inductor wiring line, the second inductor wiring line, and the third inductor wiring line are arranged inside the same layer,
   the second pad of the first inductor wiring line is also the second pad of the second inductor wiring line and the second pad of the third inductor wiring line,
   at least part of the wiring line body of each inductor wiring line from an end of the wiring line body near the second pad extends in a radial manner, and
   when N is the total number of inductor wiring lines including the first inductor wiring line, the second inductor wiring line, and the third inductor wiring line that are connected to each other by the second pad,
   an angular pitch $\theta$ between adjacent inductor wiring lines at the parts of the inductor wiring lines that extend in a radial manner is $360/2N < \theta < 360/0.5N$.

5. The inductor component according to claim 1, further comprising:
   a third inductor wiring line that is arranged inside the magnetic layer and along which a current flows in the common direction as in the first and second inductor wiring lines between a first end portion of the third inductor wiring line that is on one side and a second end portion of the third inductor wiring line that is on another side in the extension direction of the third inductor wiring line;
a fourth vertical wiring line that is connected to the first end portion of the third inductor wiring line, that penetrates through the magnetic layer, and that is exposed at the outer surface of the magnetic layer; and
a fifth vertical wiring line that is connected to the second end portion of the third inductor wiring line, that penetrates through the magnetic layer, and that is exposed at the outer surface of the magnetic layer.

6. The inductor component according to claim 3, wherein there are a plurality of each of the third inductor wiring line and the fourth vertical wiring line.

7. The inductor component according to claim 2, wherein the second vertical wiring line is located nearer a center of the layer of the first inductor wiring line than the first end portion of the first inductor wiring line and the first end portion of the second inductor wiring line when viewed in a direction perpendicular to the layer of the first inductor wiring line.

8. The inductor component according to claim 1, wherein the first inductor wiring line and the second inductor wiring line are arranged in different layers from each other, and
the second vertical wiring line is arranged in a layer that is located between the layer in which the first inductor wiring line is arranged and the layer in which the second inductor wiring line is arranged.

9. The inductor component according to claim 1, wherein the first inductor wiring line and the second inductor wiring line each include a wiring line body, a first pad that is connected to the wiring line body and is configured as the first end portion of the inductor wiring line, and a second pad that is connected to the wiring line body and is configured as the second end portion of the inductor wiring line, and
a length of the wiring line body of the first inductor wiring line and a length of the wiring line body of the second inductor wiring line are identical.

10. The inductor component according to claim 1, wherein
the first inductor wiring line and the second inductor wiring line each include a wiring line body, a first pad that is connected to the wiring line body and is configured as the first end portion of the inductor wiring line, and a second pad that is connected to the wiring line body and is configured as the second end portion of the inductor wiring line, and
a length of the wiring line body of the first inductor wiring line and a length of the wiring line body of the second inductor wiring line are different from each other.

11. The inductor component according to claim 1, wherein
a number of turns of each of the first inductor wiring line and the second inductor wiring line is less than 1.0 turns.

12. The inductor component according to claim 1, wherein
the magnetic layer includes a resin and a metal magnetic powder, and
a minimum distance between the first end portions is greater than or equal to 20 times an average particle diameter of the metal magnetic powder.

13. The inductor component according to claim 1, wherein
at least part of an outer surface of each of the first inductor wiring line and the second inductor wiring line is covered by an insulating resin having a higher insulating property than the first inductor wiring line and the second inductor wiring line.

14. The inductor component according to claim 2, further comprising:
a third inductor wiring line that is arranged inside the magnetic layer and along which a current flows in the common direction as in the first and second inductor wiring lines between a first end portion of the third inductor wiring line that is on one side and a second end portion of the third inductor wiring line that is on the other side in the extension direction of the third inductor wiring line; and
a fourth vertical wiring line that is connected to the first end portion of the third inductor wiring line, that penetrates through the magnetic layer, and is exposed at the outer surface of the magnetic layer;
wherein the second vertical wiring line is connected to the second end portion of the third inductor wiring line.

15. An inductor component comprising:
first and second inductor wiring lines that are arranged inside a magnetic layer and along which a current flows in a common direction between first end portions of the first and second inductor wiring lines that are on one side and second end portions of the first and second inductor wiring lines that are on another side in extension directions of the inductor wiring lines;
a first vertical wiring line that is connected to the first end portion of the first inductor wiring line, penetrates through the magnetic layer, and is exposed at an outer surface of the magnetic layer;
a second vertical wiring line that is connected to the second end portion of the first inductor wiring line, penetrates through the magnetic layer, and is exposed at the outer surface of the magnetic layer;
a third vertical wiring line that is connected to the first end portion of the second inductor wiring line, penetrates through the magnetic layer, and is exposed at the outer surface of the magnetic layer;
a fourth vertical wiring line that is connected to the second end portion of the second inductor wiring line, penetrates through the magnetic layer, and is exposed at the outer surface of the magnetic layer;
a first outer terminal that is connected to a part of the first vertical wiring line that is exposed at the outer surface of the magnetic layer;
a second outer terminal that is connected to a part of the second vertical wiring line that is exposed at the outer surface of the magnetic layer, and is connected to the fourth vertical wiring line; and
a third outer terminal that is connected to a part of the third vertical wiring line that is exposed at the outer surface of the magnetic layer.

16. The inductor component according to claim 15, wherein the first inductor wiring line and the second inductor wiring line are arranged inside the same layer, and
the second end portion of the first inductor wiring line is also the second end portion of the second inductor wiring line.

17. The inductor component according to claim 15, further comprising:

a third inductor wiring line that is arranged inside the magnetic layer and along which a current flows in the common direction as in the first and second inductor wiring lines between a first end portion of the third inductor wiring line that is on one side and a second end portion of the third inductor wiring line that is on another side in the extension direction of the third inductor wiring line; and a fourth vertical wiring line that is connected to the first end portion of the third inductor wiring line, that penetrates through the magnetic layer, and that is exposed at the outer surface of the magnetic layer;

wherein the second vertical wiring line is connected to the second end portion of the third inductor wiring line.

18. The inductor component according to claim 15, further comprising:

a third inductor wiring line that is arranged inside the magnetic layer and along which a current flows in the common direction as in the first and second inductor wiring lines between a first end portion of the third inductor wiring line that is on one side and a second end portion of the third inductor wiring line that is on another side in the extension direction of the third inductor wiring line;

a fourth vertical wiring line that is connected to the first end portion of the third inductor wiring line, that penetrates through the magnetic layer, and that is exposed at the outer surface of the magnetic layer; and a fifth vertical wiring line that is connected to the second end portion of the third inductor wiring line, penetrates through the magnetic layer, and is exposed at the outer surface of the magnetic layer.

19. An inductor component mounted substrate comprising:

an inductor component; and a substrate on which the inductor component is mounted;

wherein the inductor component includes first and second inductor wiring lines that are arranged inside a magnetic layer and along which a current flows in a common direction between first end portions of the first and second inductor wiring lines that are on one side and second end portions of the first and second inductor wiring lines that are on another side in extension directions of the inductor wiring lines, and the second end portions of the first and second inductor wiring lines are the same, a first vertical wiring line that is connected to the first end portion of the first inductor wiring line, penetrates through the magnetic layer, and is exposed at an outer surface of the magnetic layer, a second vertical wiring line that is connected to the second end portion of the first inductor wiring line, is connected to the second end portion of the second inductor wiring line, penetrates through the magnetic layer, and is exposed at the outer surface of the magnetic layer, and a third vertical wiring line that is connected to the first end portion of the second inductor wiring line, penetrates through the magnetic layer, and is exposed at the outer surface of the magnetic layer, the substrate includes a first input wiring line to which an input voltage is applied, a second input wiring line to which the input voltage is applied, and an output wiring line to which an output voltage that is lower than the input voltage is applied, the first input wiring line is connected to the first vertical wiring line, the second input wiring line is connected to the third vertical wiring line, and the output wiring line is connected to the second vertical wiring line.

20. An inductor component mounted substrate comprising:

an inductor component; and a substrate on which the inductor component is mounted;

wherein the inductor component includes first and second inductor wiring lines that are arranged inside a magnetic layer and along which a current flows in a common direction between first end portions of the first and second inductor wiring lines that are on one side and second end portions of the first and second inductor wiring lines that are on another side in extension directions of the inductor wiring lines, a first vertical wiring line that is connected to the first end portion of the first inductor wiring line, penetrates through the magnetic layer, and is exposed at an outer surface of the magnetic layer, a second vertical wiring line that is connected to the second end portion of the first inductor wiring line, penetrates through the magnetic layer, and is exposed at the outer surface of the magnetic layer, a third vertical wiring line that is connected to the first end portion of the second inductor wiring line, penetrates through the magnetic layer, and is exposed at the outer surface of the magnetic layer, a fourth vertical wiring line that is connected to the second end portion of the second inductor wiring line, penetrates through the magnetic layer, and is exposed at the outer surface of the magnetic layer, a first outer terminal that is connected to a part of the first vertical wiring line that is exposed at the outer surface of the magnetic layer, a second outer terminal that is connected to a part of the second vertical wiring line that is exposed at the outer surface of the magnetic layer and is connected to the fourth vertical wiring line, and a third outer terminal that is connected to a part of the third vertical wiring line that is exposed at the outer surface of the magnetic layer, the substrate includes a first input wiring line to which an input voltage is applied, a second input wiring line to which the input voltage is applied, and an output wiring line to which an output voltage that is lower than the input voltage is applied, the first input wiring line is connected to the first outer terminal, the second input wiring line is connected to the third outer terminal, and the output wiring line is connected to the second outer terminal.

21. An inductor component comprising:

first and second inductor wiring lines that are arranged inside a magnetic layer and along which a current flows in a common direction between first end portions of the first and second inductor wiring lines that are on one side and second end portions of the first and second inductor wiring lines that are on another side in extension directions of the inductor wiring lines;

a first vertical wiring line that is connected to the first end portion of the first inductor wiring line, penetrates through the magnetic layer, and is exposed at an outer surface of the magnetic layer;

a second vertical wiring line that is connected to the second end portion of the first inductor wiring line, is connected to the second end portion of the second inductor wiring line, penetrates through the magnetic layer, and is exposed at the outer surface of the magnetic layer;

a third vertical wiring line that is connected to the first end portion of the second inductor wiring line, penetrates through the magnetic layer, and is exposed at the outer surface of the magnetic layer;

a third inductor wiring line that is arranged inside the magnetic layer and along which a current flows in the common direction as in the first and second inductor wiring lines between a first end portion of the third inductor wiring line that is on one side and a second end portion of the third inductor wiring line that is on the other side in the extension direction of the third inductor wiring line; and a fourth vertical wiring line that is connected to the first end portion of the third inductor wiring line, that penetrates through the magnetic layer, and is exposed at the outer surface of the magnetic layer;

wherein the second vertical wiring line is connected to the second end portion of the third inductor wiring line, the first inductor wiring line, the second inductor wiring line, and the third inductor wiring line each include a wiring line body, a first pad that is connected to the wiring line body and is configured as the first end portion of the inductor wiring line, and a second pad that is connected to the wiring line body and is configured as the second end portion of the inductor wiring line, the first inductor wiring line, the second inductor wiring line, and the third inductor wiring line are arranged inside the same layer, the second pad of the first inductor wiring line is also the second pad of the second inductor wiring line and the second pad of the third inductor wiring line, at least part of the wiring line body of each inductor wiring line from an end of the wiring line body near the second pad extends in a radial manner, and when N is the total number of inductor wiring lines including the first inductor wiring line, the second inductor wiring line, and the third inductor wiring line that are connected to each other by the second pad, an angular pitch $\theta$ between adjacent inductor wiring lines at the parts of the inductor wiring lines that extend in a radial manner is $360/2N < \theta < 360/0.5N$.

* * * * *